United States Patent
Moon et al.

(10) Patent No.: US 11,252,831 B2
(45) Date of Patent: Feb. 15, 2022

(54) ELECTRONIC DEVICE INCLUDING OPENING

(71) Applicant: SAMSUNG ELECTRONICS CO., LTD., Suwon-si (KR)

(72) Inventors: Heecheul Moon, Suwon-si (KR); Sangyoup Seok, Suwon-si (KR); Kwonho Son, Suwon-si (KR); Yongho Hwang, Suwon-si (KR); Minwoo Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/901,159

(22) Filed: Jun. 15, 2020

(65) Prior Publication Data

US 2021/0051808 A1 Feb. 18, 2021

(30) Foreign Application Priority Data

Aug. 14, 2019 (KR) .................. 10-2019-0099912

(51) Int. Cl.
*H05K 7/02* (2006.01)
*H05K 7/04* (2006.01)
*H05K 5/02* (2006.01)
*G01L 1/22* (2006.01)

(52) U.S. Cl.
CPC ............. *H05K 5/0217* (2013.01); *G01L 1/22* (2013.01)

(58) Field of Classification Search
USPC ....................................... 361/807
See application file for complete search history.

(56) References Cited

U.S. PATENT DOCUMENTS

| 9,283,592 | B2* | 3/2016 | Chang ................. H01L 51/0011 |
| 10,466,830 | B2* | 11/2019 | Lee ....................... G06F 1/1626 |
| 2010/0013775 | A1 | 1/2010 | Son |
| 2011/0171768 | A1* | 7/2011 | Hong .................... C23C 14/042 438/34 |
| 2013/0335357 | A1 | 12/2013 | Hou |
| 2018/0364763 | A1 | 12/2018 | Shim et al. |

(Continued)

FOREIGN PATENT DOCUMENTS

KR 10-2019-0017347 2/2019
WO 2010-036050 4/2010

OTHER PUBLICATIONS

Search Report and Written Opinion dated Sep. 29, 2020 in counterpart International Patent Application No. PCT/KR2020/007642.

*Primary Examiner* — Hung S. Bui
(74) *Attorney, Agent, or Firm* — Nixon & Vanderhye P.C.

(57) ABSTRACT

An electronic device according to various embodiments includes: a housing; at least one input area disposed on an outer surface of the housing and facing a first direction; a sensor assembly including at least one pressure sensor disposed on an inner surface of the housing facing a second direction opposite the first direction, and configured to sense pressure applied to the input area; at least one first opening provided at a first portion of the housing adjacent to the sensor assembly; and a second opening provided at a second portion of the housing spaced apart from the first opening in the second direction, wherein the first opening and the second opening are configured to be deformed based on the pressure that is applied to the input area.

20 Claims, 17 Drawing Sheets

(56) References Cited

U.S. PATENT DOCUMENTS

| | | |
|---|---|---|
| 2019/0052744 A1 | 2/2019 | Jung et al. |
| 2019/0067754 A1 | 2/2019 | Gu et al. |
| 2019/0073077 A1 | 3/2019 | Kim et al. |
| 2019/0102028 A1 | 4/2019 | Keen et al. |
| 2021/0132728 A1* | 5/2021 | Hwang ................. G06F 1/1626 |

* cited by examiner

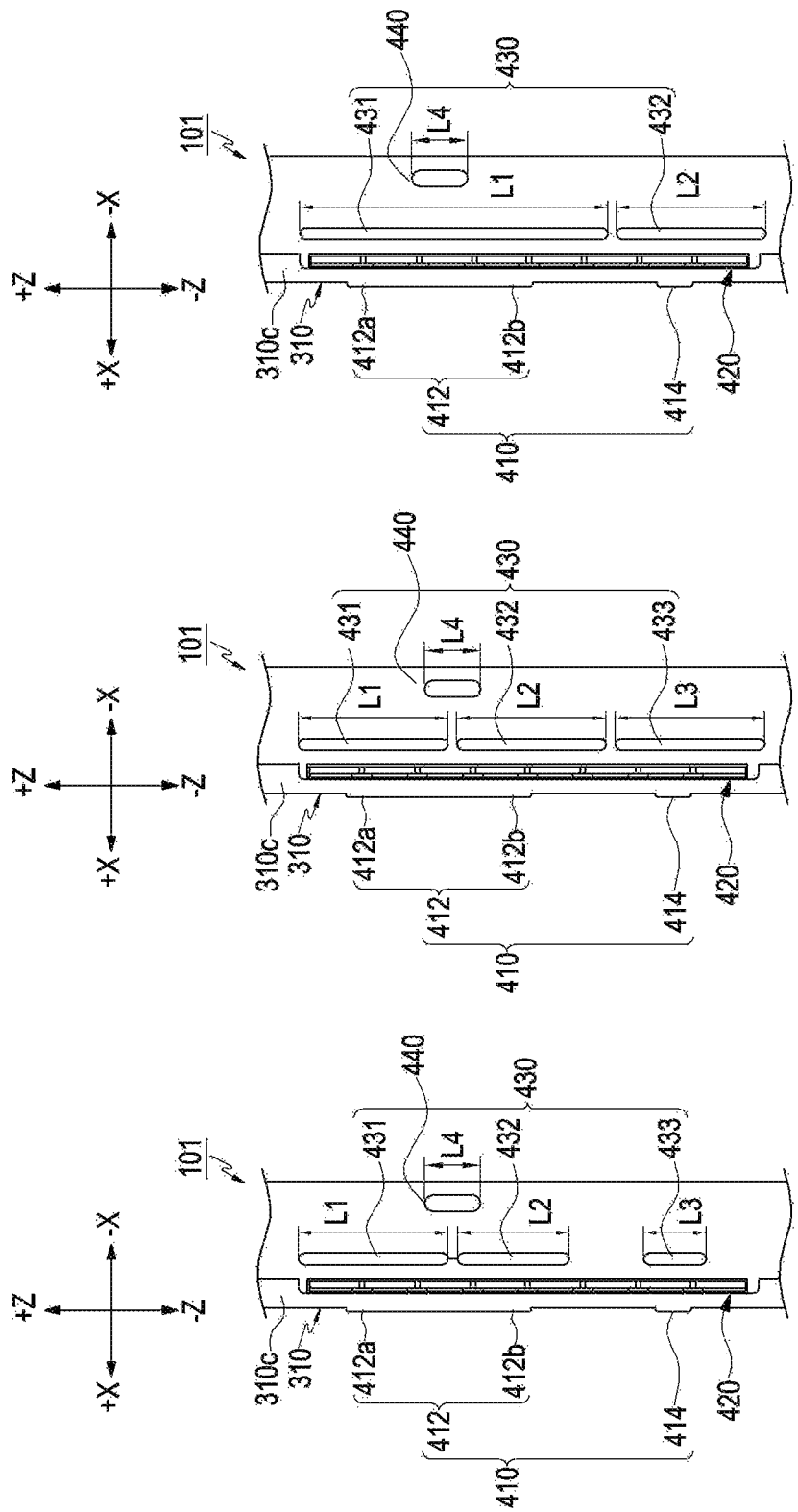

ELECTRONIC DEVICE INCLUDING OPENING

CROSS-REFERENCE TO RELATED APPLICATION

This application is based on and claims priority under 35 U.S.C. § 119 to Korean Patent Application No. 10-2019-0099912, filed on Aug. 14, 2019, in the Korean Intellectual Property Office, the disclosure of which is incorporated by reference herein in its entirety.

BACKGROUND

Field

The disclosure relates to an electronic device including an opening and a supporting member having an opening.

Description of Related Art

Electronic devices can output information stored therein using sound or images. As electronic devices are highly integrated and high-speed and large-capacity wireless communication has been popularized, recently, various functions can be integrated in one electronic device such as a mobile communication terminal. For example, not only a communication function, but an entertainment function such as a game, a multimedia function such as playback of music/video, a communication and security function for mobile banking, and the function of schedule manager and an electronic wallet, etc., have been integrated in one electronic device.

Physical keys for controlling the calling volume, controlling the playback volume of multimedia files, or turning on/off the screen while such various functions are performed may be disposed on a side of an electronic device.

When the physical keys disposed on a side of an electronic device are pressed, the physical keys are inserted in the electronic device and brought in contact with a dome switch on a printed circuit board, and the dome switch can generate an electrical signal. The generated electrical signal is transmitted to a processor on the printed circuit board, whereby functions associated with the key input can be performed.

When a physical key disposed on a side of an electronic device is pressed, the physical key protrudes out of an in-out hole formed in the electronic device or is inserted into the electronic device by elasticity of a dome switch. However, according to this structure, when physical keys protrude out of the in-out hole, not only the aesthetic appearance of the product is deteriorated, but also a malfunction may occur when the physical keys are unexpectedly pressed regardless of the user's intention. When the physical keys are physically repeatedly pressed for a long period of time, the elasticity of the dome switch may decrease, so the pressure is not concentrated on the dome switch, which may deteriorate the operational response of the keys.

SUMMARY

Embodiments of the disclosure provide an electronic device including a sensor assembly configured to sense information corresponding to deformation of at least one input area disposed on the outer surface of a housing instead of physical keys.

Embodiments of the disclosure provide an electronic device having a bridge that prevents and/or reduces bending of the electronic device.

However, the disclosure is not limited to the example embodiments described and may be expanded in various ways without departing from the spirit and scope of the disclosure.

An electronic device according to various example embodiments includes: a housing; at least one input area disposed on an outer surface of the housing that faces a first direction; a sensor assembly including at least one pressure sensor disposed on an inner surface of the housing facing a second direction opposite the first direction, the sensor assembly configured to sense pressure applied to the input area; at least one first opening provided at a first portion of the housing adjacent to the sensor assembly; and a second opening provided at a second portion of the housing spaced apart from the first opening in the second direction, wherein the first opening and the second opening are configured to be deformed based on the pressure applied to the input area.

An electronic device according to various example embodiments includes: a housing; at least one input area disposed on an outer surface of the housing; a sensor assembly including at least one sensor disposed on an inner surface facing a second direction opposite the outer surface and configured to sense pressure applied to the input area; a plurality of first openings provided at the housing adjacent to the sensor assembly; at least one bridge disposed between the first openings; and a second opening spaced apart from the bridge in the second direction, wherein the first opening and the second opening may be configured to concentrate the pressure applied to the sensor assembly.

A bracket of an electronic device according to various example embodiments includes: at least one input area disposed on a side of the bracket facing a first direction; a seating area configured to accommodate a sensor assembly, the sensor assembly configured to sense pressure applied to the input area; a first opening spaced apart from the seating area in a second direction opposite the first direction; and a second opening spaced apart from the first opening in the second direction, wherein the first opening and the second opening are configured to be deformed based on pressure being applied to the input area.

An electronic device according to various example embodiments can provide an input area integrally formed on the outer surface of a housing of the electronic device. Accordingly, the aesthetic appearance of the electronic device is increased and the phenomenon that the input area may be unintenionally pressed regardless of the intention of a user, leading to a misoperation of a key, can be prevented and/or reduced.

An electronic device according to various example embodiments can provide an opening that concentrates pressure applied to the input area to the sensor assembly. Accordingly, the sensitivity of the sensor assembly can be improved.

An electronic device according to various example embodiments can provide a bridge that increases the rigidity of the housing. Accordingly, bending of the electronic device can be prevented and/or reduced.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 15A is a side cross-sectional view illustrating an example first opening and second opening of the electronic device according to various embodiments;

FIG. 15B is a side cross-sectional illustrating an example first opening and second opening of the electronic device according to various embodiments;

FIG. 15C is a side cross-sectional illustrating an example first opening and second opening of the electronic device according to various embodiments;

DETAILED DESCRIPTION

Figure 1:
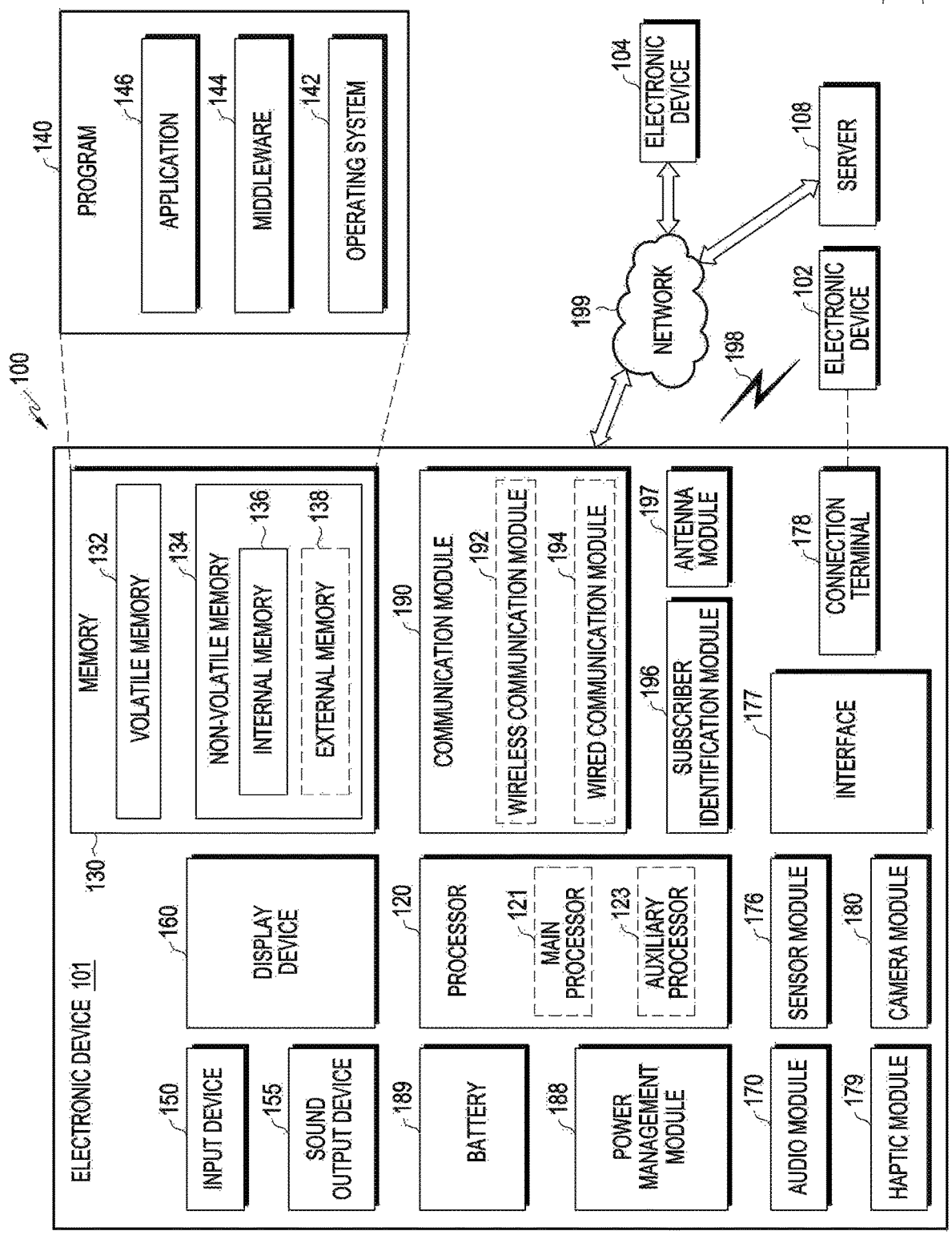
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element include a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
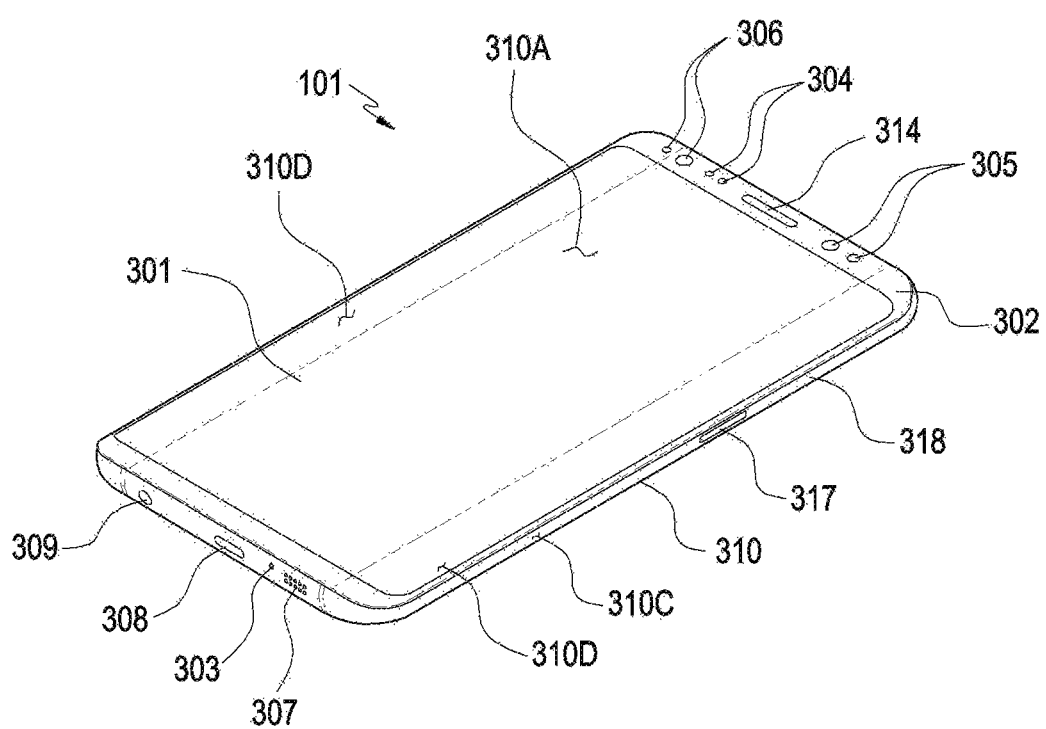
FIG. 2 is a front perspective view of the electronic device according to various embodiments.
Figure 3:
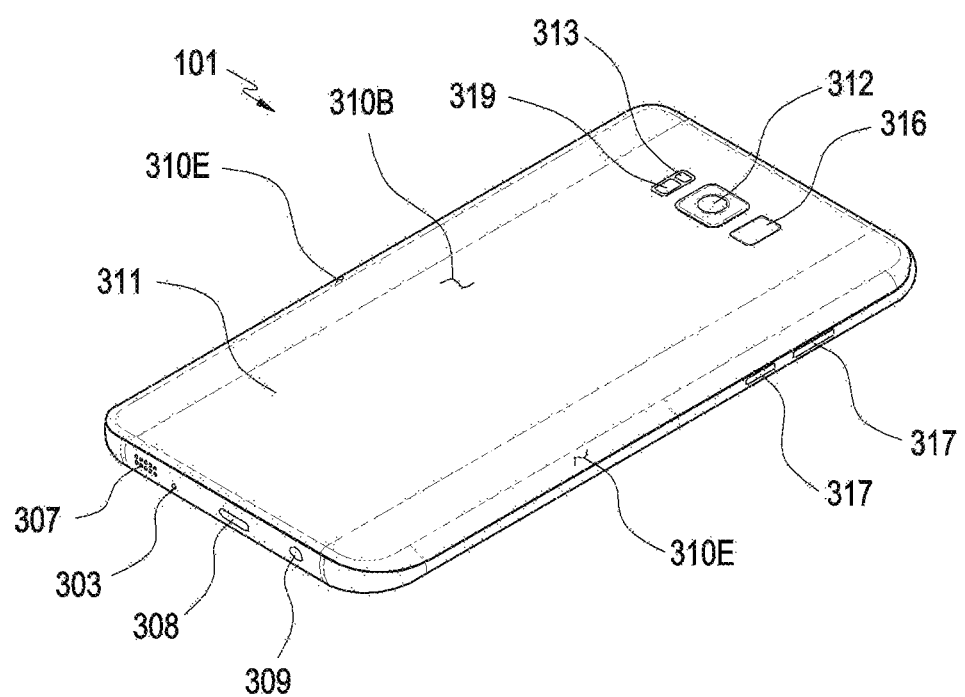
FIG. 3 is a rear perspective view of the electronic device according to various embodiments.

FIG. 2 is a front perspective view of an example electronic device 101 according to various embodiments. FIG. 3 is a rear perspective view of the example electronic device 101 according to various embodiments.

Referring to FIGS. 2 and 3, an electronic device 101 according to an embodiment may include a housing 310 (e.g., the housing 310 shown in FIGS. 2 and 3) having a first surface (or a front surface) 310A, a second surface (or a rear surface) 310B, and a side (e.g., the side 310C shown in FIGS. 2 and 3) surrounding the space between the first surface 310A and the second surface 310B. In another embodiment (not shown), the housing 310 may refer to a structure forming some of a first surface shown in FIG. 2 (e.g., the first surface 310A shown in FIG. 2), a second surface (e.g., the second surface 310B shown in FIG. 3), and a side 310C. According to an embodiment, the first surface 310A may be at least partially substantially formed by a transparent front plate 302 (e.g., a glass plate or a polymer plate including various coating layers). The second surface 310B may be formed by a substantially opaque rear plate 311. The rear plate 311, for example, may be made of coated or colored glass, ceramic, a polymer, metal (e.g., aluminum, stainless steel (STS), or magnesium), or a combination of at least two of these materials. The side 310C is combined with a front plate 302 and a rear plate 311 and may be formed by a lateral bezel structure 318 (or a "lateral member") including metal and/or a polymer. In an embodiment, the rear plate 311 and the lateral bezel structure 318 may be integrated and may include the same material (e.g., a metallic material such as aluminum).

In the embodiment shown in the figures, the front plate 302 may have two first regions 310D, which bend toward the rear plate 311 from the first surface 310A and seamlessly extend, at both long edges of the front plate 302. In the shown embodiment (referring to FIG. 3), the rear plate 311 may have two second regions 310E, which bend toward the front plate 302 from the second surface 310B and seamlessly extend, at both long edges. In an embodiment, the front plate 302 (or the rear plate 311) may have only one of the first regions 310D (or the second regions 310E). In another embodiment, some of the first regions 310D or the second regions 310E may not be included. In the embodiments, when seen from a side of the electronic device 101, the lateral bezel structure 318 may have a first thickness (or width) at the sides not including the first regions 310D or the second regions 310E and may have a second thickness less than the first thickness at the sides including the first regions 310D or the second regions 310E.

According to an embodiment, the electronic device 101 may include at least one or more of a display 301, an audio module 303, 307, 314, a sensor module 304, 316, 319, a camera module 305, 312, 313, a key input device 317, a light emitting element 306, and connector holes 308 and 309. In an embodiment, the electronic device 101 may not include at least one (e.g., the key input devices 400 or the light emitting element 306) of the components, or may further include other components.

The display 301, for example, may be exposed through a large part of the front plate 302. In an embodiment, at least a portion of the display 301 may be exposed through the front plate 302 forming the first surface 310A and the first regions 310D of the side 310C. In an embodiment, the edge of the display 301 may be formed substantially in the same shape as the adjacent outline shape of the front plate 302. In another embodiment (not shown), in order to enlarge the exposed area of the display 301, the gap between the outline of the display 301 and the outline of the front plate 302 may be substantially uniform.

In another embodiment (not shown), a recess or an opening may be formed in a portion of a display region of the display 301, and at least one or more of the audio module 314, the sensor module 304, the camera module 305, and the light emitting element 306 aligned with the recess or the opening may be included. In another embodiment (not shown), at least one or more of the audio module 314, the sensor module 304, the camera module 305, the fingerprint sensor 316, and the light emitting element 306 may be disposed on the rear surface of the display region of the display 301. In another embodiment (not shown), the display 301 may be combined with or disposed adjacent to a touch sensing circuit, a pressure sensor that can measure the intensity (pressure) of a touch, and/or a digitizer that detects a magnetic stylus pen. In an embodiment, at least a portion of the sensor module 304, 319 and/or at least a portion of the key input device 400 may be disposed in the first regions 310D and/or the second regions 310E.

The audio module 303, 307, 314 may include a microphone hole 303 and speaker holes 307 and 314. A microphone for capturing external sounds may be disposed in the microphone hole 303, and in an embodiment, a plurality of microphones may be disposed therein to sense direction of sounds. The speaker holes 307 and 314 may include an external speaker hole 307 and a receiver hole 314 for a telephone call. In an embodiment, the speaker holes 307 and 314 and the microphone hole 303 may be integrated into one hole or a speaker (e.g., a piezo speaker) may be included without the speaker holes 307 and 314.

The sensor module 304, 316, 319 can generate an electrical signal or a data value corresponding to the internal operation state of the electronic device 101 or an external environmental state. The sensor module 304, 316, 319, for example, may include a first sensor module 304 (e.g., a proximity sensor) and/or a second sensor module (not shown) (e.g., a fingerprint sensor) disposed on the first surface 310A of the housing 310, and/or a third sensor module 319 (e.g., an HRM sensor) and/or a fourth sensor module 316 (e.g., a fingerprint sensor) disposed on the second surface 310B of the housing 310. The fingerprint sensor may be disposed not only on the first surface 310A (e.g., the display 301), but also on the second surface 310B of the housing 310. The electronic device 101 may further include a sensor module (not shown), for example, at least one of a gesture sensor, a gyro sensor, a barometer sensor, a magnetic sensor, an acceleration sensor, a grip sensor, a color sensor, an IR (Infrared) sensor, a biosensor, a temperature sensor, a humidity sensor, or an illumination sensor 304.

The camera module 305, 312, 313 may include a first camera 305 disposed on the first surface 310A of the electronic device 101, and a second camera 312 and/or a flash 313 disposed on the second surface 310B. The camera modules 305 and 312 may include one or more lenses, an image sensor, and/or an image signal processor. A flash 313, for example, may include a light emitting diode or a xenon lamp. In an embodiment, two or more lenses (an infrared camera lens, a wide-angle lens, and a telephoto lens) and image sensors may be disposed on one surface of the electronic device 101.

The light emitting element 306, for example, may be disposed on the first surface 310A of the housing 310. The light emitting element 306, for example, may provide state information of the electronic device 101 in a light type. In another embodiment, the light emitting element 306, for example, may provide a light source that operates with the operation of the camera module 305. The light emitting element 306, for example, may include an LED, an IR LED, and a xenon lamp.

The connector holes 308 and 309 may include a first connector hole 308 that can accommodate a connector (e.g., a USB connector) for transmitting and receiving power and/or data to and from external electronic devices and/or a second connector hole 309 (e.g., an earphone jack) that can accommodate a connector for transmitting and receiving audio signals to and from external electronic devices.

Figure 4:
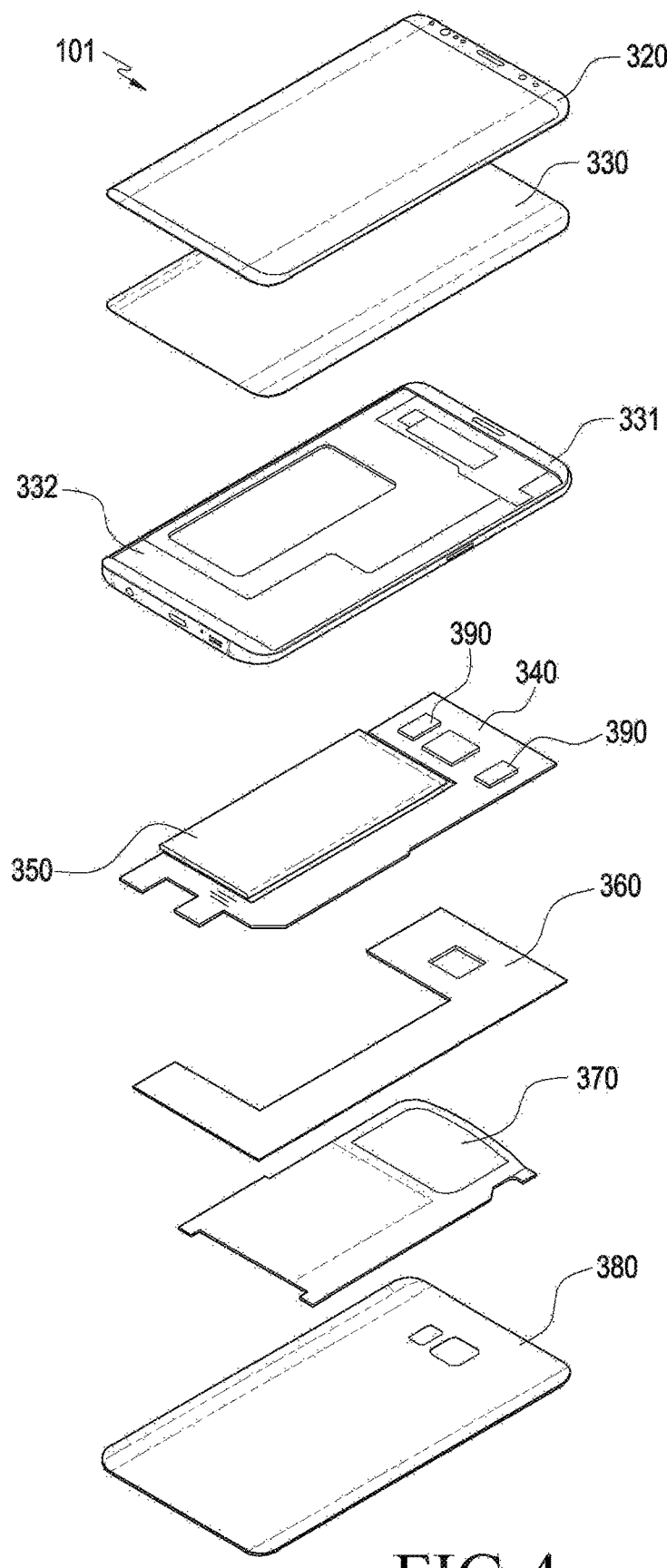
FIG. 4 is an exploded perspective view of an electronic device according to various embodiments.

FIG. 4 is an exploded perspective view illustrating an example electronic device 101 according to various embodiments.

Referring to FIG. 4, an electronic device 101 (e.g., the electronic device 101 shown in FIGS. 1 to 3) may include a lateral bezel structure (e.g. a housing) 331, a first supporting member 332 (e.g., a bracket), a front plate 320, a display 330, a printed circuit board 340, a battery 350, a second supporting member 360 (e.g., a rear case), an antenna 370, and a rear plate 380. In an embodiment, the electronic device 101 may not include at least one (e.g., the first supporting member 332 or the second supporting member 360) of the components, or may further include other components. At least one of the components of the electronic device 101 may be the same as or similar to at least one of the electronic device 101 shown in FIG. 2 or FIG. 3, and repeated description is omitted below.

The first supporting member 332 is disposed in the electronic device 101 and may be connected with the lateral bezel structure 331 or may be integrated with the lateral bezel structure 331. The first supporting member 332, for example, may be made of a metallic material and/or a non-metallic material (e.g., a polymer). The display 330 may be coupled to a surface of the first supporting member 332 and the printed circuit board 340 may be coupled to the other surface of the first supporting member 332. A processor, a memory, and/or an interface may be mounted on the printed circuit board 340. The processor, for example, may include one or more of a CPU, an application processor, a graphic processor, an image signal processor, a sensor hub processor, or a communication processor.

The memory, for example, may include a volatile memory or a nonvolatile memory.

The interface, for example, may include a High Definition Multimedia Interface (HDMI), a Universal Serial Bus (USB) interface, an SD card interface, and/or an audio interface. The interface, for example, can electrically or physically connect the electronic device 101 to external electronic devices and may include an USB connector, an SD card/MMC connector, or an audio connector.

The battery 350, which is a device for supplying power to one or more components of the electronic device 101, for example, may include a primary battery that is not rechargeable, a secondary battery that is rechargeable, or a fuel cell. At least a portion of the battery 350, for example, may be disposed in substantially the same plane as the printed circuit board 340. The battery 350 may be integrally disposed in the electronic device 101 and may be detachably attached to the electronic device 101.

The antenna 370 may be disposed between the rear plate 380 and the battery 350. The antenna 370, for example, may include a Near Field Communication (NFC) antenna, a wireless charging antenna, and/or a Magnetic Secure Transmission (MST) antenna. The antenna 370, for example, can perform near field communication with external devices or can wirelessly transmit and receive power for charging. In another embodiment, an antenna structure may be formed by a portion or a combination of the lateral bezel structure 331 and/or the first supporting member 332.

According to various embodiments, an electronic device may include a plurality of communication devices 390. For example, some of the communication devices 390 may be implemented to transmit/receive radio waves having different characteristics (temporarily referred to radio waves in frequency bands A and B) to implement MIMO. As another example, some of the communication devices 390 may be configured, for example, to simultaneously transmit/receive radio waves (temporarily referred to as radio waves of frequencies A1 and A2 in the frequency band A) having the same characteristics to implement diversity. As another example, other some of the communication devices 390 may be configured, for example, to simultaneously transmit/receive radio waves (temporarily referred to as radio waves of frequencies B1 and B2 in the frequency band B) having the same characteristics to implement diversity. Although two communication devices may be included in an embodiment, the electronic device may include four communication devices, thereby being able to implement both MIMO and diversity in another embodiment. In another embodiment, the electronic device 101 may include only one communication device 390.

According to an embodiment, in consideration of the transmission/reception characteristics of radio waves, when one communication device is disposed at a first position on the printed circuit board 340, another communication device may be disposed at a second position separated from the first position on the printed circuit board 340. As another example, one communication device and another communication device may be disposed in consideration of the gap therebetween according to a diversity characteristic.

According to an embodiment, at least one communication device 390 may include a wireless communication circuit that processes radio waves transmitted/received in a super-high frequency (e.g., 6 GHz or more and 300 GHz or less). A radiation conductor(s) of the at least one communication device 390, for example, may be a patch type radiation conductor or a radiation conductor having a dipole structure extending in one direction, and a plurality of radiation conductors may be arrayed, thereby being able to form an antenna array. A chip (e.g., an integrated circuit chip), including some of the wireless communication circuit, etc. may be disposed on a side of a region where the radiation conductor is disposed or on a surface opposite to the surface where the radiation conductor is disposed, and for example, the chip may be electrically connected with the radiation conductor(s) through wires in a printed circuit pattern.

Figure 5:
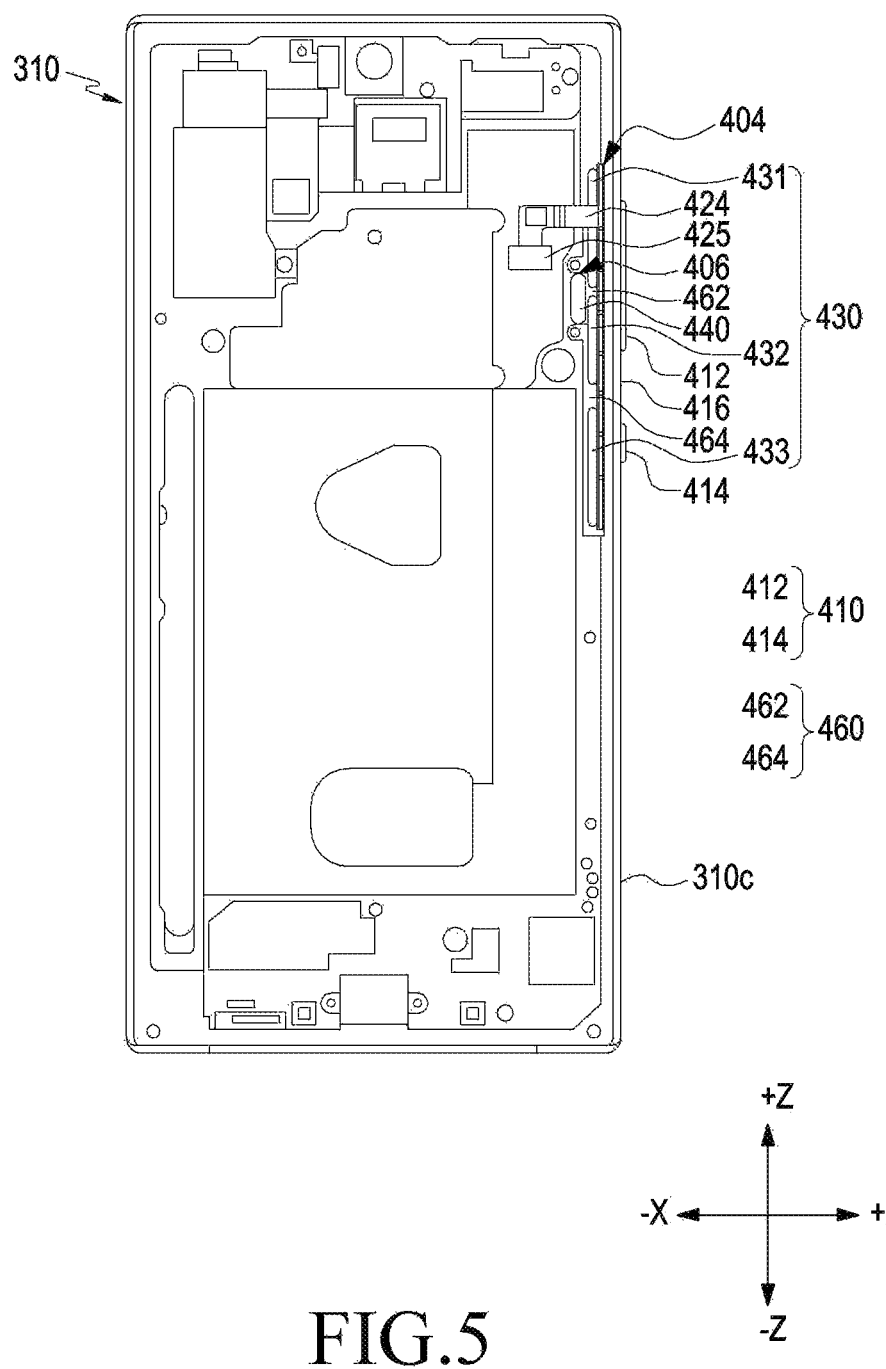
FIG. 5 is a diagram illustrating an example sensor assembly disposed in an electronic device according to various embodiments.
Figure 6:
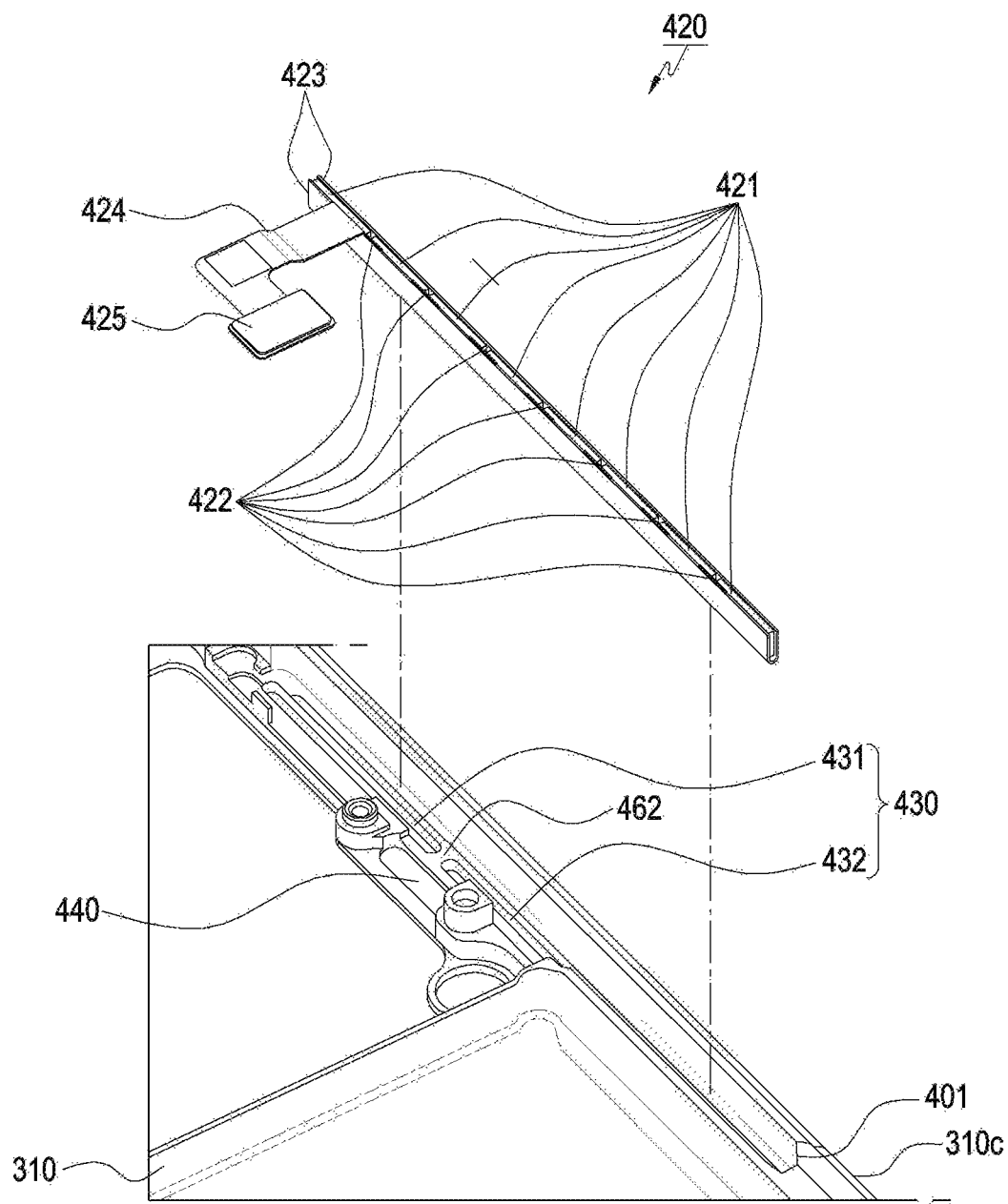
FIG. 6 is a perspective view illustrating an example sensor assembly separated from the housing according to various embodiments.
Figure 7:
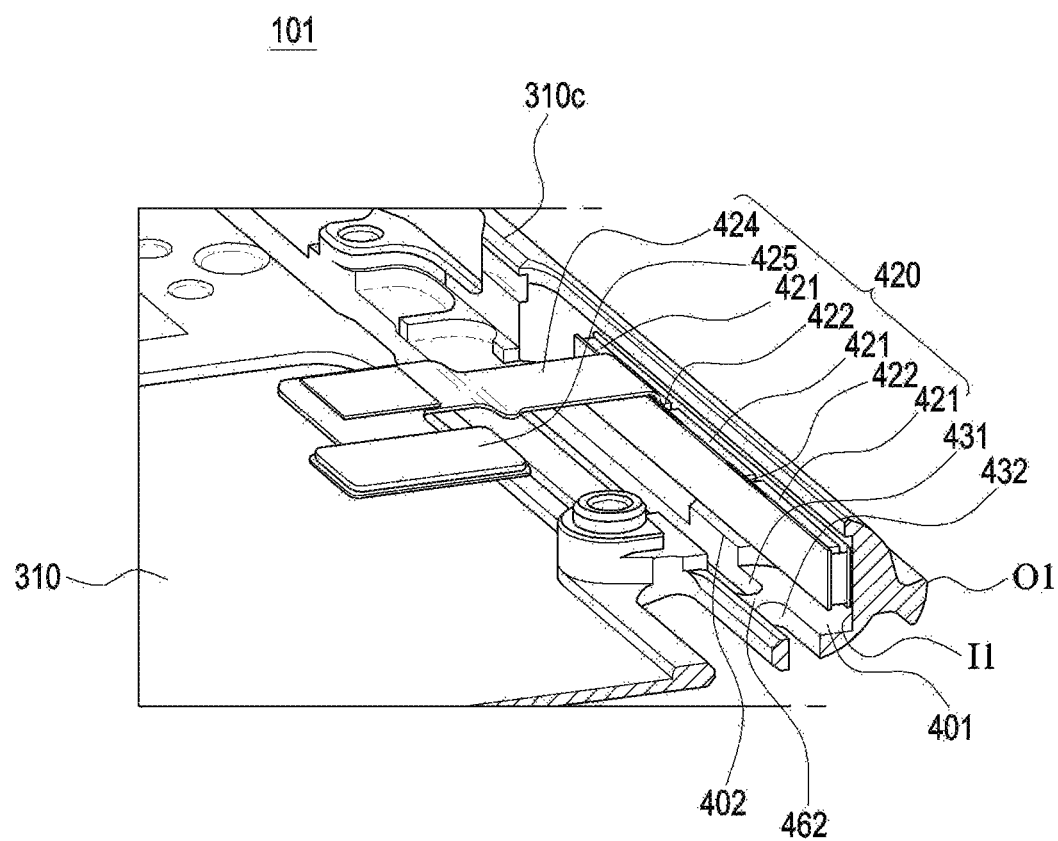
FIG. 7 is a partial perspective view illustrating an example coupled state of the sensor assembly included in the electronic device according to various embodiments.
Figure 8:
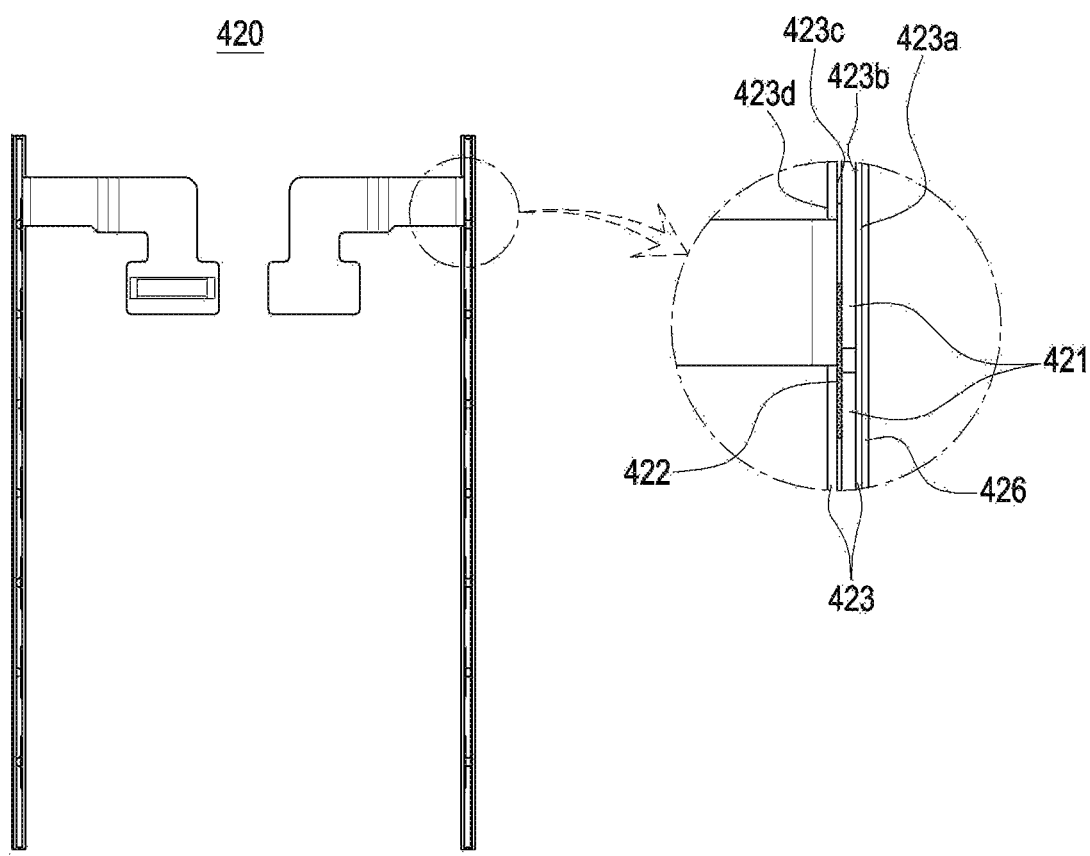
FIG. 8 is a diagram illustrating an example sensor assembly according to various embodiments.
Figure 9:
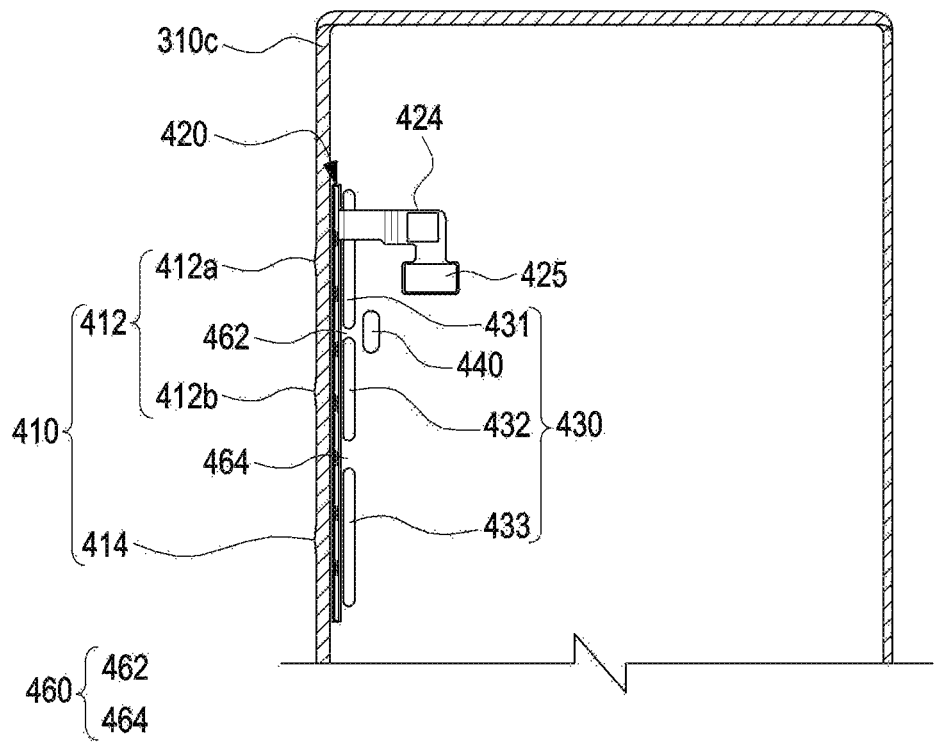
FIG. 9 is a diagram illustrating an example sensor assembly disposed in the electronic device according to various embodiments.

FIG. 5 is a diagram illustrating an example sensor assembly disposed in an electronic device according to various embodiments. FIG. 6 is a perspective view illustrating an example sensor assembly separated from the housing according to various embodiments. FIG. 7 is a partial perspective view illustrating an example coupled state of the sensor assembly included in the electronic device according to various embodiments. FIG. 8 is a diagram illustrating an example sensor assembly according to various embodiments. FIG. 9 is diagram illustrating an example sensor assembly disposed in the electronic device according to various embodiments.

Referring to FIGS. 5, 6, 7, 8 and 9, an electronic device 101 may include a housing 310, at least one input area 410, a sensor assembly 420, and at least one first opening 430, second opening 440, and bridge 460. The configuration of the electronic device 101 and the housing 310 shown in FIGS. 5, 6, 7, 8 and 9 may be entirely or partially the same as or similar to the configuration of the electronic device 101 and the housing 310 shown in FIGS. 1, 2, 3 and 4.

According to various embodiments, the housing 310 may form the external shape of the electronic device 101. For example, the housing 310 may have a first surface (or front surface) (e.g., the first surface 301A shown in FIGS. 2 to 3), a second surface (or rear surface) (e.g., the second surface 310B shown in FIGS. 2 and 3), and a side 310C (e.g., the side 310C shown in FIGS. 2 and 3) surrounding the space between the first surface 310A and the second surface 310B. The surface facing a first direction (+X direction) of the outer surface of the housing 310 may be defined as the side 310C.

According to various embodiments, a seating area 401 configured to accommodate the sensor assembly 420 to be described below may be formed in the side 310C. According to an embodiment, the seating area 401 may be formed in a groove shape on the housing 310. According to another embodiment, the seating area 401 may be formed in an open shape through the housing 310.

According to various embodiments, a seating member 402 for seating the sensor assembly 420 in the seating area 401 may be formed around the seating area 401. For example, the sensor assembly 420 may be coupled to the seating area 401 formed in the side 310C and may be seated in the seating area 401 in contact with the seating member 402. Accordingly, the sensor assembly 420 may be prevented from and/or reduce separating from the seating area 401 by the seating member 402.

According to various embodiments, the housing 310 may include a first supporting member (e.g., the supporting member 332 shown in FIG. 4). The first supporting member 332 may be connected with the side 301C or may be formed integrally with the side 310C. In an embodiment, the first supporting member 332 may be defined as a bracket.

According to various embodiments, the input area 410 may be positioned on the outer surface of the housing 310 that faces the first direction (+X direction). For example, the input area 410 may be an area formed on the side 310C of the housing 310.

According to various embodiments, the input area 410 may be exposed to the outside and may obtain input from a user. For example, the input area 410 can obtain pressure (e.g., pressure P1 shown in FIGS. 10A AND 10B) applied from the outside (e.g., a finger of a user). The input area 410 may be deformed when obtaining the pressure P1.

According to various embodiments, the input area 410 may include, for example, and without limitation, at least one of a side key, a volume-up/down key, a function key, a Bixby key, a power key, a camera shutter key, or the like. A side key, a volume-up/down key, a function key, a Bixby key, a power key, and a camera shutter key are illustrated, by way of non-limiting example as the input area 410 in the embodiment, but the input area 410 is not limited thereto. For example, the input area 410 may be applied in various ways as long as it is pressed by pressure P1 applied from the outside.

According to various embodiments, the input area 410 may include a first input area 412 and a second input area 414. According to an embodiment, when the first input area 412 is seen in the first direction (+X direction), at least a portion of the first input area 412 may overlap a plurality of first openings 430. According to another embodiment, when the second input area 414 is seen in the first direction (+X direction), at least a portion of the second input area 414 may overlap one first opening 430. The first input area 412 may be a volume-up/down key and the second input area 414 may be a Bixby key. The processor (e.g., the processor 120 shown in FIG. 1) can control the volume-up/down key function and the Bixby key function.

According to various embodiments, the first input area 412 may include a third input area 412a and a fourth input area 412b so that the processor (e.g., the processor 120 shown in FIG. 1) may discriminate and determine pressure P1 from the outside obtained in one input area. For example, the first input area 412 may include a third input area 412a formed in a third direction (+Z direction) of the first input area 412 and a fourth input area 412b formed in a fourth direction (−Z direction) of the first input area 412. According to an embodiment, the third input area 412a may be used as a volume-up key and the fourth input area 412b may be used as a volume-down key.

According to various embodiments, the sensor assembly 420 that may sense pressure on the input area 410 may be disposed above an inner surface I1 of the housing 310 that faces a second direction (−X direction) that is the opposite direction to the first direction (+X direction). For example, the sensor assembly 420 may be disposed on the inner surface I1 of the housing 310 formed in the opposite direction to the side 310C of the housing 310 where the input area 410 is formed, and may sense deformation of the input area 410 by pressure P1 applied from the outside (e.g., a finger of a user). When the sensor assembly 420 is seen in the first direction (+X direction), at least a portion of the sensor assembly 420 may overlap the input area 410. Although only the electronic device 101 in which the input area 410 is disposed on the outer surface O1 of the housing 310 that faces the first direction (+X direction) is described in the embodiment, those skilled in the art may apply the disclosure to an electronic device 101 in which the input area 410 is disposed on an outer surface O1 of the housing 310 facing at least one of the first direction (+X direction) or the second direction (−X direction).

According to various embodiments, the sensor assembly 420 may include at least one plate 421, at least one pressure sensor 422, and a flexible printed circuit board 423.

According to various embodiments, the at least one plate 421 may be deformed by pressure P1 applied from the outside (e.g., a finger of a user). The plate 421 may be made of a material that can be deformed by the pressure P1, for example, and without limitation, stainless steel STS. When a plurality of plates 421 are provided, the magnitude of deformation of the sensor assembly 420 based on the pressure P1 may increase.

According to various embodiments, the at least one pressure sensor 422 can sense deformation of the plate 421. For example, the pressure sensor 422 may be a strain gauge and may sense a change in electrical resistance based on deformation of the plate 421.

According to various embodiments, the flexible printed circuit board 423 is electrically connected with the pressure sensor 422, thereby being able to provide a signal path for transmitting a signal sensed by the pressure sensor 422 to the processor (e.g., the processor 120 shown in FIG. 1).

According to various embodiments, the flexible printed circuit board 423 may surround the at least one plate 421 and the at least one pressure sensor 422 to protect the at least one plate 421 and the at least one pressure sensor 422. For example, the flexible printed circuit board 423 may have a first surface 423a facing the inner surface I1 of the housing 310, a second surface 423b facing the opposite direction to the first surface 423a, a third surface 423c facing the second surface, and a fourth surface 423d facing the opposite direction to the third surface 423c. The plate 421 may be disposed on the second surface 423b and the pressure sensor 422 may be disposed between the third surface 423c and the plate 421.

According to various embodiments, the flexible printed circuit board 423 may be disposed in a folded shape. For example, a surface of the flexible printed circuit board may include the first surface 423a and the fourth surface 423d and another surface formed in the opposite direction to the above surface may include the second surface 423b and the third surface 423c.

According to various embodiments, the sensor assembly 420 may be electrically connected with the processor 120 included in the electronic device 101. The processor 120 may be disposed on a printed circuit board (e.g., the printed circuit board 340 shown in FIG. 4) of the electronic device 101. According to an embodiment, the sensor assembly 420 may be electrically connected with the processor 120 through a flexible circuit 424 electrically connected with the flexible printed circuit board 423 and a connection terminal 425 disposed at an end of the flexible circuit 424. For example, an end of the flexible circuit 424 may be electrically connected with the flexible printed circuit board 423 and the other end of the flexible circuit 424 may be electrically connected with a terminal (not shown) of the printed circuit board 340 through the connection terminal 425.

According to various embodiments, the sensor assembly 420 may transmit a signal generated based on deformation of the plate 421 to the processor 120. For example, when the at least one input area 410 is deformed by pressure P1 applied from the outside (e.g., a finger of a user), the at least one plate 421 is also deformed, and in this case, the at least one input sensor 422 may sense and convert the deformation of the plate 421 into a signal. The pressure sensor 422 may transmit the signal generated based on deformation of the plate 421 to the processor 120 through the flexible printed circuit board 423, the flexible circuit 424, and the connection terminal 425. The processor 120 may receive the signal from the pressure sensor 422 and control the operation of the electronic device 101. For example, the processor 120 may sense pressure P1 applied to the input area 410 from the outside (e.g., a finger of a user) through the pressure sensor 420 and may perform functions configured in the input area 410 (e.g., at least one of a side key function, the function of a volume-up/down key, the function of a function key, the function of a Bixby key, the function of a power key, or the function of a camera shutter).

According to various embodiments, the sensor assembly 420 may be coupled to the housing 310 in various ways. According to an embodiment, the sensor assembly 420 may be coupled to the housing 310, based on the seating area 401 and the seating member 402. According to another embodiment, the sensor assembly 420 may be coupled to the housing 310 through an attaching member 426 coupled to the flexible circuit board 423. For example, the attaching member 426 including an adhesive material (e.g., a bonding tape) may be disposed between the first surface 423a and the inner surface I1 of the housing 310. The attachment member 426 can be coupled to the housing 310 by pressure that is provided by a jig (not shown) or external wind.

According to various embodiments, the at least one first opening 430 may be formed at the housing 310 adjacent to the sensor assembly 420. According to an embodiment, the first opening 430 may be formed at a first portion 404 of the housing 310 that is adjacent to the sensor assembly 420. The first portion 404 may be at least one of a portion of the housing 310 spaced in the second direction (−X direction) apart from the seating area 401 in which the sensor assembly 420 is accommodated or a portion of the housing 310 spaced in the second direction (−X direction) apart from the input area 410. According to another embodiment, the first opening 430 may be spaced in the second direction (−X direction) apart from the at least one plate 421 or the at least one pressure sensor 422 disposed in the housing 310. According to an embodiment, when the first opening 430 is seen in the first direction (+X direction), the input area 410 may overlap at least a portion of the first opening 430.

According to various embodiments, the first opening 430 may be an opening formed at the first portion 404 of the housing 310. According to an embodiment, the first opening 430 may be formed as a plurality of pieces. For example, the first opening 430 may include at least one of a fourth opening 431, a fifth opening 432, or a sixth opening 433.

According to various embodiments, the fourth opening 431 and the fifth opening 432 may be formed to correspond to the first input area 412. For example, when the first input area 412 is seen in the first direction (+X direction), at least a portion of the fourth opening 431 and at least a portion of the fifth opening 432 may overlap the first input area 412. The sixth opening 433 may be formed to correspond to the second input area 414. For example, when the second input area 414 is seen in the first direction (+X direction), at least a portion of the sixth opening 433 may overlap the second input area 414. Although the first opening 430 is described by way of non-limiting example as including the fourth opening 431, the fifth opening 432, or the sixth opening 433 in the embodiment, but is not limited thereto. For example, if it is an opening formed at the first portion 404, it may be defined as the first opening 430 regardless of the number. The opening may, for example, be a through-hole.

According to various embodiments, the second opening 440 may be formed at the housing 310 spaced apart from the first opening 430 in the second direction (−X). According to an embodiment, the second opening 440 may be a portion of the housing 310 spaced apart from the first portion 404 in the second direction (−X direction). According to another embodiment, the second opening 440 may be spaced apart from the sensor assembly 420 further than the first opening 430. For example, the distance between the second opening 440 and the fourth surface 423d of the flexible circuit board 423 may be longer than the distance between the first opening 430 and the fourth surface 423d of the flexible circuit board 423.

According to various embodiments, the second opening 440 may be configured to correspond to the first input area 412. According to an embodiment, when the second opening 440 is seen in the first direction (+X direction), at least a portion of the second opening 440 may overlap the first opening 430 configured to correspond to the first input area 412. According to another embodiment, when the second opening 440 is seen in the first direction (+X direction), at least a portion of the second opening 440 may overlap the fourth opening 431 and the fifth opening 432. Although the second opening 440 is described as one opening in the embodiment, but is not limited thereto. For example, if it is an opening formed at a second portion 406 spaced apart from the first portion 404 in the second direction (−X direction), it may be defined as the second opening 440 regardless of the number.

According to various embodiments, the bridge 460 may be formed between at least one first opening 430. For example, the bridge 460 may include a first bridge 462 formed between the fourth opening 431 and the fifth opening 432 and a second bridge 464 formed between the fifth opening 432 and the sixth opening 433.

According to an embodiment, when the first bridge 462 is seen in the first direction (+X direction), at least a portion of the first bridge 462 may overlap the first input area 412. For example, the third input area 412a may be disposed in a third direction (+Z) in the first input area 412 overlapping the first bridge 462 and the fourth input area 412b may be disposed in the fourth direction (−Z) in the first input area 412 overlapping the first bridge 462. According to another embodiment, when the second bridge 462 is seen in the first direction (+X direction), at least a portion of the second bridge 462 may overlap a grip area 416. The grip area 416 is a area disposed on the side 310C of the housing 310 formed between the first input area 412 and the second input area 414.

According to various embodiments, the bridge 460 can absorb compression stress and tension stress that are generated by external pressure P1. According to an embodiment, when external pressure P1 is applied to the second input area 414, the second bridge 464 absorbs compression stress and tension stress generated by the pressure P1, thereby being able to decrease deformation of at least one of the fourth opening 431 or the fifth opening 432 corresponding to the first input area 412 in comparison to deformation of the sixth opening 433. According to another embodiment, when external pressure P1 is applied to the third input area 412a, the first bridge 462 absorbs compression stress and tension stress generated by the pressure P1, thereby being able to decrease deformation of at least one of the fifth opening 432 or the sixth opening 433 in comparison to deformation of the fourth opening 431. According to another embodiment, when external pressure P1 is applied to the fourth input area 412b, the first bridge 462 and the second bridge 464 absorb compression stress and tension stress generated by the pressure P1, thereby being able to decrease deformation of at least one of the fourth opening 431 or the sixth opening 433 in comparison to deformation of the fifth opening 432.

According to various embodiments, when external pressure P1 is applied between third input area 412a and the fourth input area 412b, the bridge 462 absorbs compression stress and tension stress generated between the third input area 412a and the fourth input area 412b by the pressure P1, thereby being able to decrease deformation of the first input area 412. When deformation of the first input area 412 decreases, pressure information obtained by the sensor assembly 420 decreases, so the processor (e.g., the processor 120 shown in FIG. 1) can determine the pressure P1 applied between the third input area 412a and the fourth input area 412b as being a misinput.

According to various embodiments, the rigidity of the housing 310 may be increased by the bridge 460. For example, the input area 410 is supported by the bridge 460, so the rigidity of the side 310C of the housing 310 is increased and bending of the electronic device 101 can be prevented. According to an embodiment, the first bridge 462 can prevent the third input area 412a or the fourth input area 412b from being pressed by external pressure P1 applied between the third input area 412a and the fourth input area 412b. According to another embodiment, the second bridge 464 can prevent the fourth input area 412b or the second input area 414 from being pressed by external pressure applied to the grip area (e.g., the grip area 416 shown in FIG. 5) positioned between the fourth input area 412b and the second input area 414.

According to various embodiments, the thickness of the housing 310 in which the bridge 460 is formed may be varied. For example, the thickness of the bridge 460 may be less than the thickness of a portion of the first supporting member (e.g., the first supporting member 332 shown in FIG. 4) having a heating sheet (not shown).

Figures 10A, 10B:
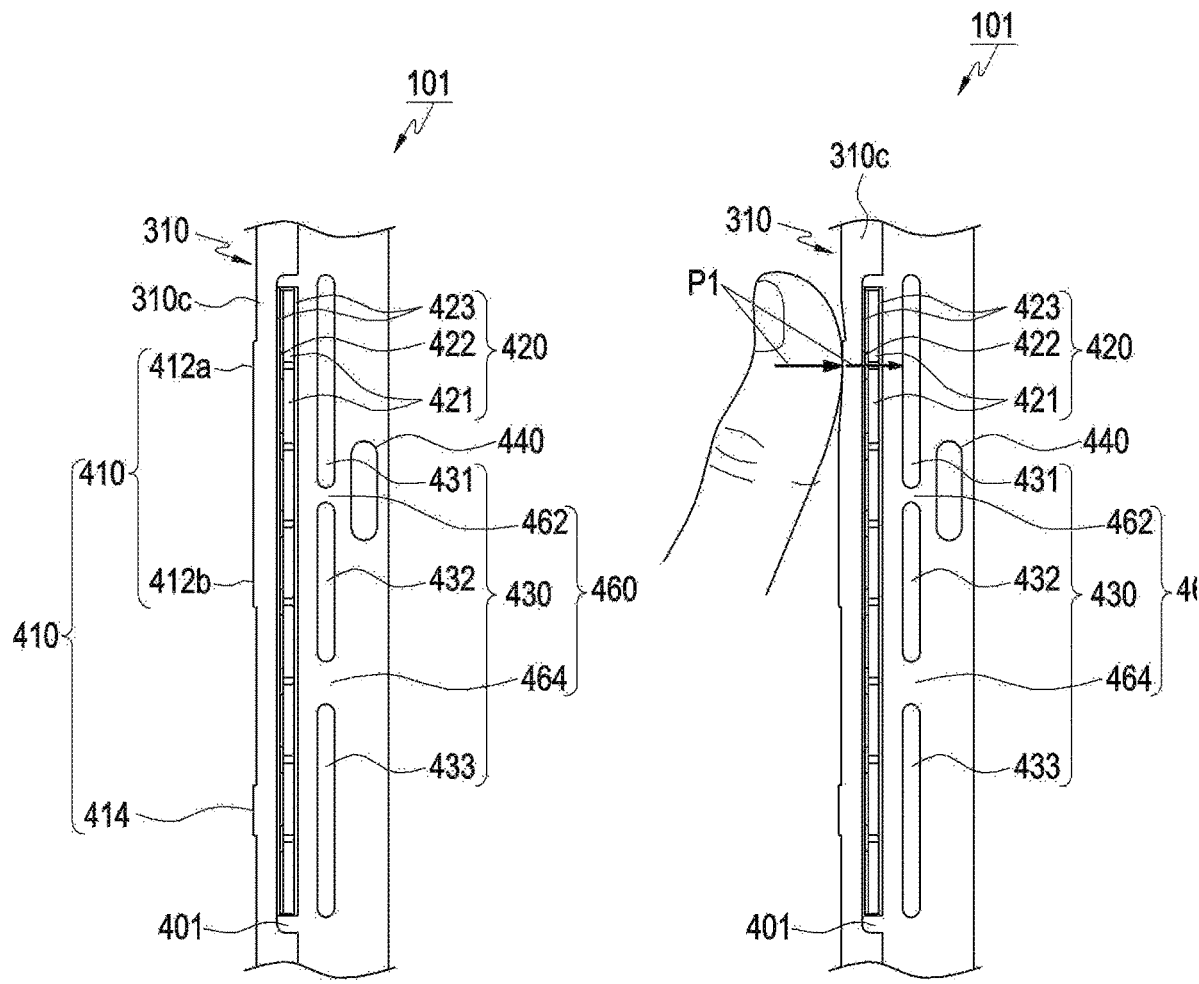
FIG. 10A is a cross-sectional view illustrating an example operation state of the electronic device according to various embodiments.
FIG. 10B is a cross-sectional view illustrating an example operation state of the electronic device according to various embodiments.
Figure 11:
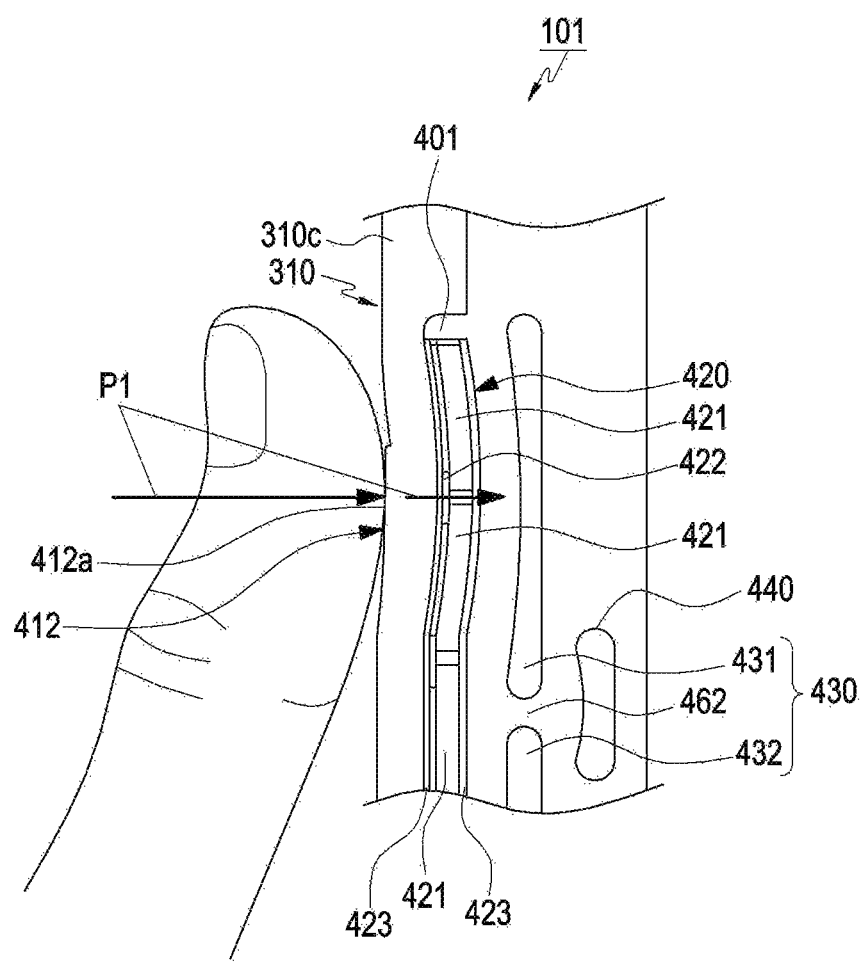
FIG. 11 is an enlarged side cross-sectional view illustrating an example operation state of the electronic device according to various embodiments.

FIG. 10A is a side cross-sectional view illustrating an example operation state of the electronic device according to various embodiments and FIG. 10B is a side cross-sectional view illustrating an example operation state of the electronic device according to various embodiments. FIG. 11 is an enlarged side cross-sectional view illustrating an example operation state of the electronic device according to various embodiments.

Referring to FIGS. 10A, 10B and 11, an electronic device 101 may include a sensor assembly 420 configured to sense external input P1 to the input area 410, and a first opening 430 and a second opening 440 configured to deform based on the external pressure to the input area 410. The configuration of the electronic device 101, the housing 310, the input area 410, the sensor assembly 420, the first opening 430, the second opening 440, and the bridge 460 shown in FIGS. 10A, 10B and 11 may be entirely or partially the same as the configuration of the electronic device 101, the housing 310, the input area 410, the sensor assembly 420, the first opening 430, the second opening 440, and the bridge 460 shown FIGS. 5, 6, 7, 8 and 9.

According to various embodiments, the magnitude of deformation of the first opening 430 and the magnitude of deformation of the second opening 440 may be changed based on at least one of the magnitude of external pressure P1, the direction of the external pressure P1, the position of the external pressure P1 applied to the electronic device 100, the shape of the input area 410, the shape of the first opening 430, the position of the first opening 430, the shape of the second opening 440, or the position of the second opening 440. According to an embodiment, the magnitude of deformation of the first opening 430 and the magnitude of deformation of the second opening 440 may be less than the level that can be visually recognized. For example, the magnitude of deformation of the first opening 430 and the magnitude of deformation of the second opening 440 may be in a range of about 0.1 µm to 0.1 mm. According to another embodiment, the magnitude of deformation of the first opening 430 and the magnitude of deformation of the second opening 440 can be visually recognized, but in this case, the electronic device 100 may not be actually bent. According to various embodiments, the first opening 430 may be deformed by external pressure P1 applied to the input area 410. When the first opening 430 is deformed, the pressure P1 may concentrate on the sensor assembly 420. For example, when the input area 410 is deformed, at least one of the fourth opening 431, the fifth opening 432, or the sixth opening 433 disposed adjacent to the sensor assembly 420 is deformed, so the pressure P1 may concentrate on the sensor assembly 420. The sensor assembly 420 can precisely obtain user input (e.g., pressure), based on the concentrated pressure P1.

According to various embodiments, the larger the size of the first opening 430, the higher the sensitivity of the sensor assembly 420 sensing pressure (e.g., pressure P1 shown in FIG. 10) applied to the input area 410 corresponding to the first opening 430 may be.

According to various embodiments, the fourth opening 431, the fifth opening 432, and/or the sixth opening 433 may be disposed to correspond to the third input area 412a, the fourth input area 421b, and/or the second input area 414, respectively. For example, the fourth opening 431 may be disposed to correspond to the third area 412a that is the volume-up key, the fifth opening 432 may be disposed to correspond to the fourth input area 414b that is the volume-down key, and the sixth opening 433 may be disposed to correspond to the second input area 414 that is the Bixby key.

According to various embodiments, deformation of the first opening 430 by the pressure P1 applied to the input area 410 may be larger than deformation of the first opening 430 by pressure Pa applied to the housing 310 except for the input area 410. For example, deformation of the fourth opening 431, the fifth opening 432, and/or the sixth opening 433 by pressure P1 applied to the third input area 412a, the fourth input area 412b, and/or the second input area 414 may be larger than deformation of the fourth opening 431, the fifth opening 432, and/or the sixth opening 433 by pressure P1 applied to the surroundings excluding the third input area 412a, the fourth input area 412b, and/or the second input area 414.

According to various embodiments, the second opening 440 may be deformed by external pressure P1 applied to the input area 410. For example, the second opening 440 may be deformed by the pressure P1 applied to the first input area 412. According to an embodiment, when the pressure P1 is applied to the third input area 412a corresponding to the fourth opening 431, at least a portion of the second opening 440 may be deformed. When the second opening 440 is deformed, the pressure P1 may concentrate on the sensor assembly 420. According to another embodiment, when the pressure P1 is applied to the fourth input area 412b corresponding to the fifth opening 432, at least a portion of the second opening 440 may be deformed. When the second opening 440 is deformed, the pressure P1 may concentrate on the sensor assembly 420. The sensor assembly 420 can precisely obtain user input (e.g., pressure), based on the concentrated pressure P1.

Figure 12:
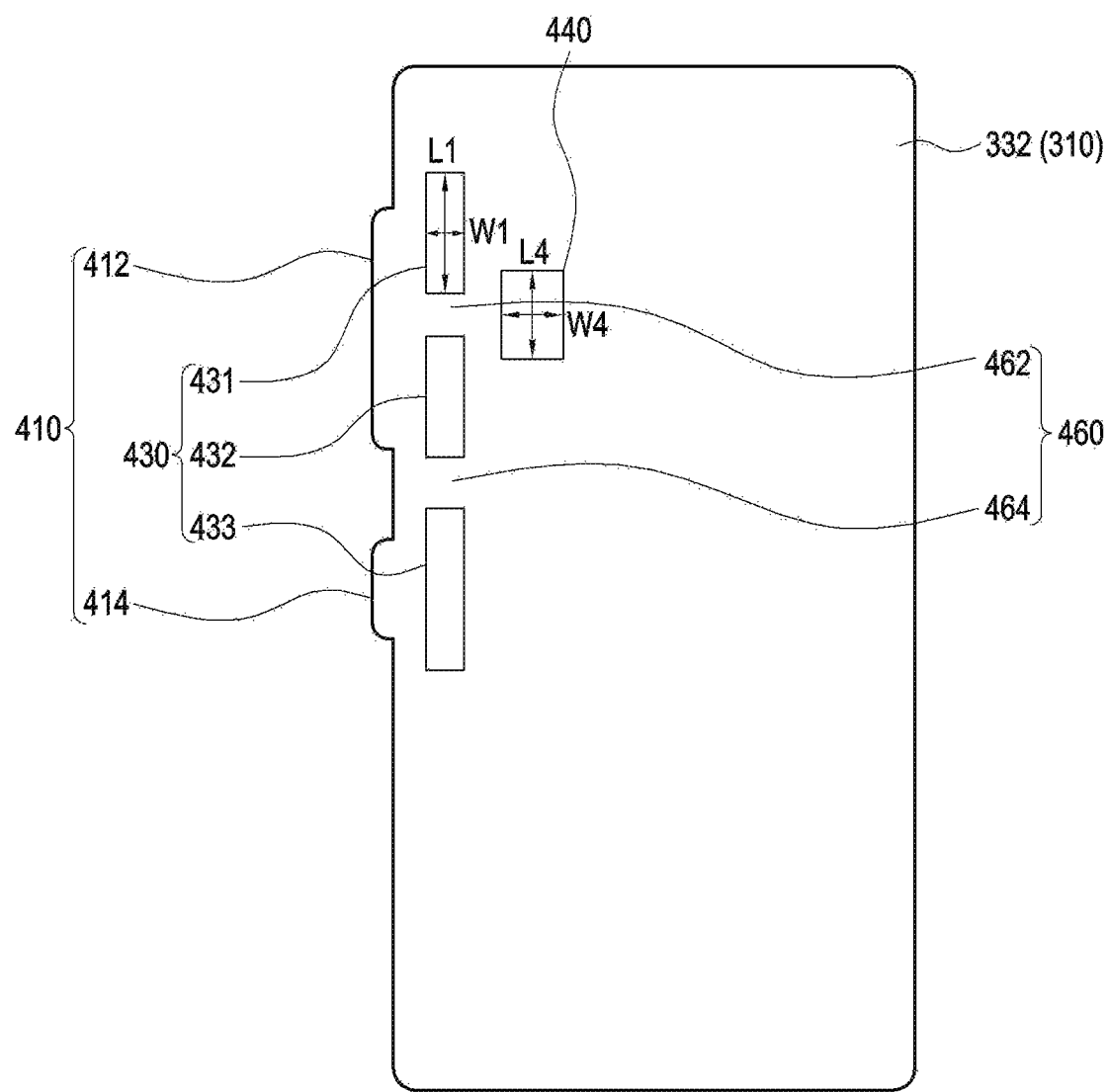
FIG. 12 is a diagram illustrating an example electronic device having a first opening and a second opening according to various embodiments.
Figure 13:
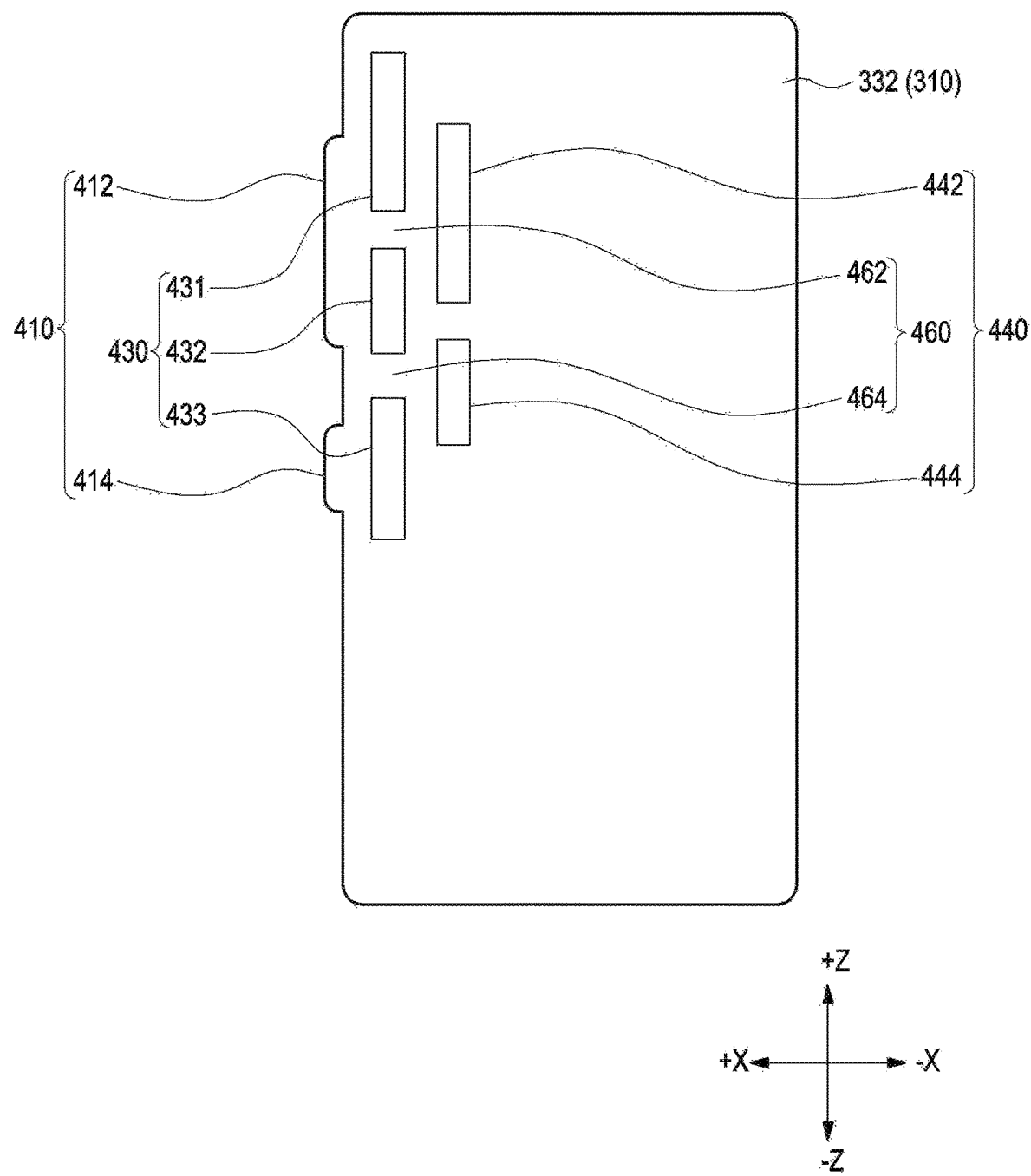
FIG. 13 is a diagram illustrating an example electronic device having the first opening and the second opening according to various embodiments.
Figure 14:
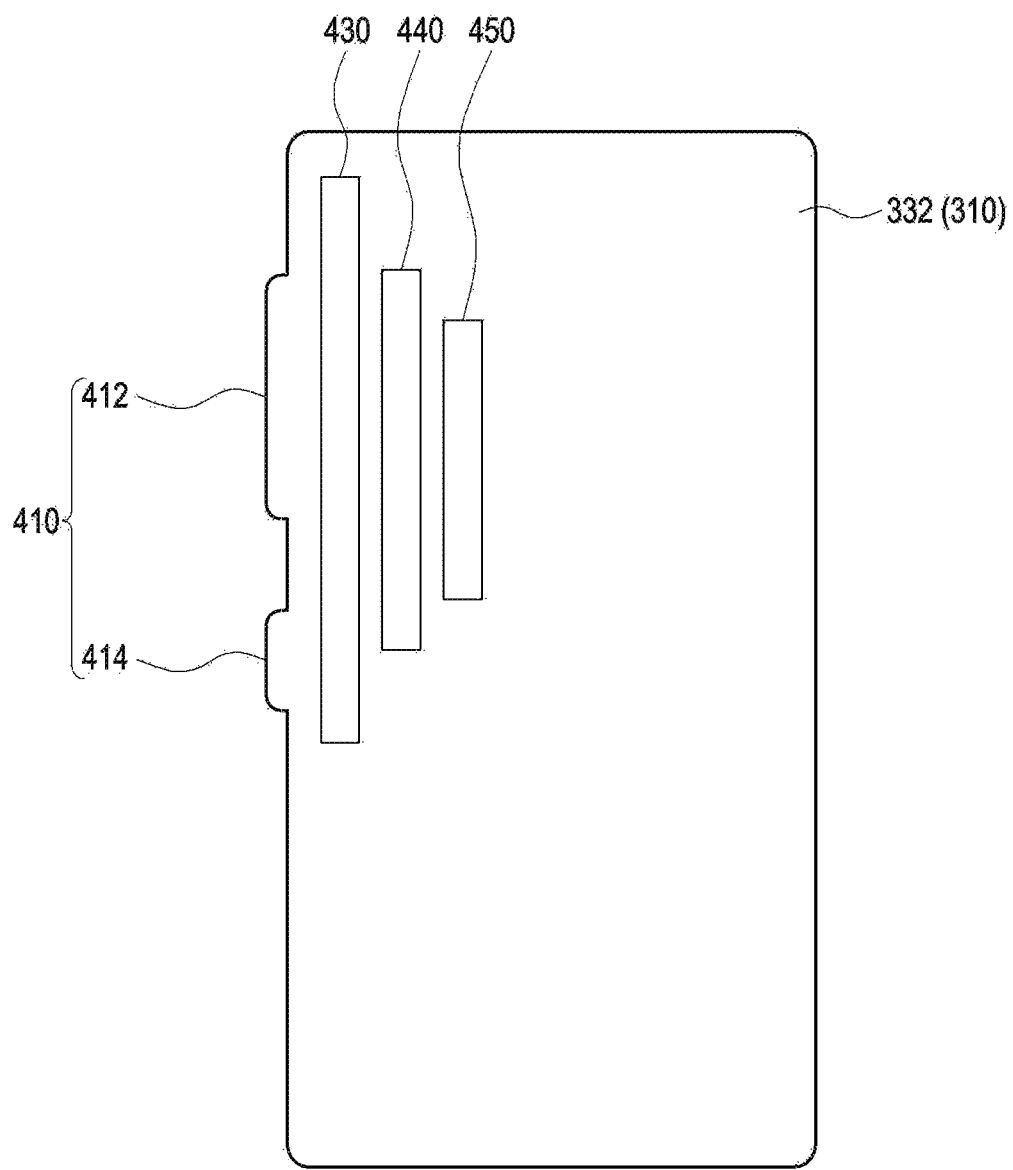
FIG. 14 is a diagram illustrating an example electronic device having a first opening, a second opening, and a third opening according to various embodiments.

FIG. 12 is a diagram illustrating an example electronic device having a first opening and a second opening according to various embodiments. FIG. 13 is a diagram illustrating an example electronic device having the first opening and the second opening according to various embodiments. FIG. 14 is a diagram illustrating an example electronic device having a first opening, a second opening, and a third opening according to various embodiments.

Referring to FIGS. 12, 13 and 14, an electronic device 101 may include a first supporting member 332, an input area 410, a first opening 430, a second opening 440, a third opening 450, and a bridge 460. The configuration of the input area 410, the first opening 430, the second opening 440, the third opening 450, and the bridge 460 shown in FIGS. 12, 13 and 14 may be entirely or partially the same as the configuration of the input area 410, the first opening 430, the second opening 440, and the bridge 460 shown in FIGS. 10A, 10B, 11, 12 and 13, and the configuration of the first supporting member 332 may be entirely or partially the same as the configuration of the first supporting member 332 shown in FIG. 4.

According to various embodiments, the first opening 430 may be formed in a structure for concentrating pressure applied to the input area 410 to the sensor assembly (e.g., the sensor assembly 420 shown in FIG. 9). When the first opening 430 is seen in the first direction (+X direction), at least a portion of the first opening 430 may overlap the first input area 412. For example, at least a portion of the fourth opening 431 may overlap at least a portion formed in the third direction (+Z direction) in the first input area 412, at least a portion of the fifth opening 432 may overlap a portion formed in the fourth direction (-Z direction) in the first input area 412, and at least a portion of the sixth opening 433 may overlap the second input area 414.

According to various embodiments, the first opening 430 and the second opening 440 may be formed at the first supporting member 332 to concentrate pressure applied to the input area 410 to the sensor assembly 420.

According to various embodiments, the first opening 430 and the second opening 440 may be formed in various shapes. According to an embodiment, the length in the third direction (+Z direction) of the first opening 430 may be longer than the length in the third direction (+Z direction) of the second opening 440. For example, the first length L1 that is the length in the third direction (+Z direction) of the fourth opening 431 may be longer than the fourth length L4 that is the length in the third direction (+Z direction) of the second opening 440. According to another embodiment, the length in the first direction (+X direction) of the first opening 430 may be shorter than the length in the first direction (+X direction) of the second opening 440. For example, the first width W1 that is the length in the first direction (+X direction) of the fourth opening 431 may be shorter than the width fourth W4 that is the length in the first direction (+X direction) of the second opening 440.

According to various embodiments, the electronic device 101 may have a first opening 430, a second opening 440, and a third opening 450. The third opening 450, which is an opening configured to deform based on the pressure (e.g., the pressure P1 shown in FIG. 11), may be spaced apart from the second opening 440 in the second direction (-X direction). For example, when the third opening 450 is seen in the first direction (+X direction), at least a portion of the first opening 430 may overlap the first input area 412 and the second input area 414, the second opening 430 may be spaced apart from the first opening 430 in the second direction (-X direction), and the third opening 450 may be spaced apart from the second opening 440 in the second direction (-X direction). When the third opening 450 is seen in the first direction (+X direction), at least a portion of the third opening 450 may overlap the second opening 440.

According to various embodiments, the first opening 430, the second opening 440, and the third opening 450 may be variously formed in the first supporting member 332. For example, in FIG. 13, when the electronic device 101 is seen in the first direction (+X direction), the first opening 430, the second opening 440, and the third opening 450 overlapping the first input area 412 and the second input area 414 are shown, but at least one of the first opening 430, the second opening 440, or the third opening 450 may overlap the first input area 412 and may not overlap the second input area 414. As another example, at least one of the first opening 430, the second opening 440, or the third opening 450 may overlap the second input area 414 and may not overlap the first input area 412.

According to various embodiments, the second opening 440 may include at least one of a seventh opening 442 or an eighth opening 444. The seventh opening 442 may be defined as the second opening 440 formed in the third direction (+Z) of the second opening 440 formed in a second portion (e.g., the second portion 406 shown in FIG. 5) of the housing 310, and the eighth opening 444 may be defined as the second opening 440 formed in the fourth direction (-Z) of the second opening 440 formed in the second portion (e.g., the second portion 406 shown in FIG. 5) of the housing 310.

According to another embodiment, when the seventh opening 442 is seen in the first direction (+X direction), at least a portion of the seventh opening 442 may overlap the fourth opening 431 and the fifth opening 432. The seventh opening 442 may be deformed in correspondence to pressure (e.g., the pressure P1 shown in FIG. 11) applied to the first input area 412. For example, the pressure P1 applied to at least one of the third input area 412a or the fourth input area 412b may concentrate on a sensor assembly (e.g., the sensor assembly 420 shown in FIG. 5), based on the deformed seventh opening 442.

According to various embodiments, when the eighth opening 444 is seen in the first direction (+X direction), at least a portion of the eighth opening 444 may overlap the fifth opening 432 and the sixth opening 433. The eighth opening 444 is deformed in correspondence to the pressure P1 applied to the first input area 412 or the second input area 414 and the pressure P1 may concentrate on the sensor assembly 420, based on the deformed eighth opening 444.

FIG. 15A is a side cross-sectional view illustrating an example first opening and second opening of the electronic device according to various embodiments, FIG. 15B is a side cross-sectional illustrating an example first opening and second opening of the electronic device according to various embodiments, and FIG. 15C is a side cross-sectional illustrating an example first opening and the second opening of the electronic device according to various embodiments.

Referring to FIGS. 15A, 15B and 15C, an electronic device 101 may have an input area 410, a first opening 430, and a second opening 440. The configuration of the input area 410, the first opening 430, and the second opening 440 shown in FIGS. 15A, 15B and 15C may be entirely or partially the same as the configuration of the input area 410, the first opening 430, and the second opening 440 shown in FIGS. 5, 6, 7, 8 and 9.

According to various embodiments, the first opening 430 and the second opening 440 may be formed in various shapes. The first opening 430 and the second opening 440 may be formed in slit shapes that are longer in one direction than another direction.

According to various embodiments, the sensitivity of the sensor assembly 420 may be changed, based on at least one of the shape of the input area 410, the shape of the first opening 430, the position of the first opening 430, the shape of the second opening 440, or the position of the second opening 440.

Referring to FIG. 15A, the lengths of the fourth opening 431, the fifth opening 432, and the sixth opening 433 may be varied, depending on the use of the input area 410. For example, the fourth opening 431 may be disposed to correspond to the third area 412a configured to function as a volume-up key, the fifth opening 432 may be disposed to correspond to the fourth input area 412b configured to function as a volume-down key, and the sixth opening 433 may be disposed to correspond to the second input area 414 configured to function as a Bixby key. A first length L1 of the fourth opening 431 or a second length L2 of the fifth opening 432 respectively corresponding to the third input area 412a or the fourth input area 412b that are used more frequently than the second input area 414 may be larger than a third length L3 of the sixth opening 433. As described above, since the sensitivity of the sensing assembly 420 is proportioned to the size of the first opening 430 corresponding to the input area 410, the sensitivity for pressure that is applied to at least one of the third input area 412a or the fourth input area 412b may be higher than the sensitivity for pressure that is applied to the second input area 414. An input operation for the first input area 412 requires relatively low pressure, so a user can simply and easily perform volume-up or volume-down that is performed through the first input area 412. An input operation for the second input area 414 requires relatively high pressure, so misinput of a Bixby function that is performed through the second area 414 can be prevented and/or reduced during using.

Referring to FIG. 15B, the first length L1 of the fourth opening 431, the second length L2 of the fifth opening 432, and the third length L3 of the sixth opening 433 may be substantially the same. According to an embodiment, even though the first length L1, the second length L2, and the third length L3 are the same, the sensitivity of the sensor assembly 420 may be changed, based on the position of the second opening 440. For example, when the second opening 440 is formed at a position corresponding to the first input area 412, the sensitivity of the sensor assembly 420 to the pressure that is applied to the first input area 412 may be higher than the sensitivity of the sensing assembly 420 to the pressure that is applied to the second input area 414.

Referring to FIG. 15C, the first opening 430 may include a fourth opening 431 and a fifth opening 432. The fourth opening 431 may be formed at the housing 310 spaced apart from the sensor assembly 420 in the second direction (−X direction) and may be disposed to correspond to the first input area 412 configured to perform at least two or more functions (e.g., volume-up and volume-down functions). The fifth opening 432 may be spaced apart from the sensor assembly 420 in the second direction (−X direction) and formed at the housing 310 and may be disposed to correspond to the second input area 414 configured to perform one function (e.g., a Bixby function). The second input area 414 configured to perform one function is defined as an input area that performs one function for substantially the same time point. For example, even if the input area 410 may be changed to perform various functions by input from a user, if it performs one function at substantially the same time point, it may be defined as the second input area 414.

Figures 16A, 16B, 16C:
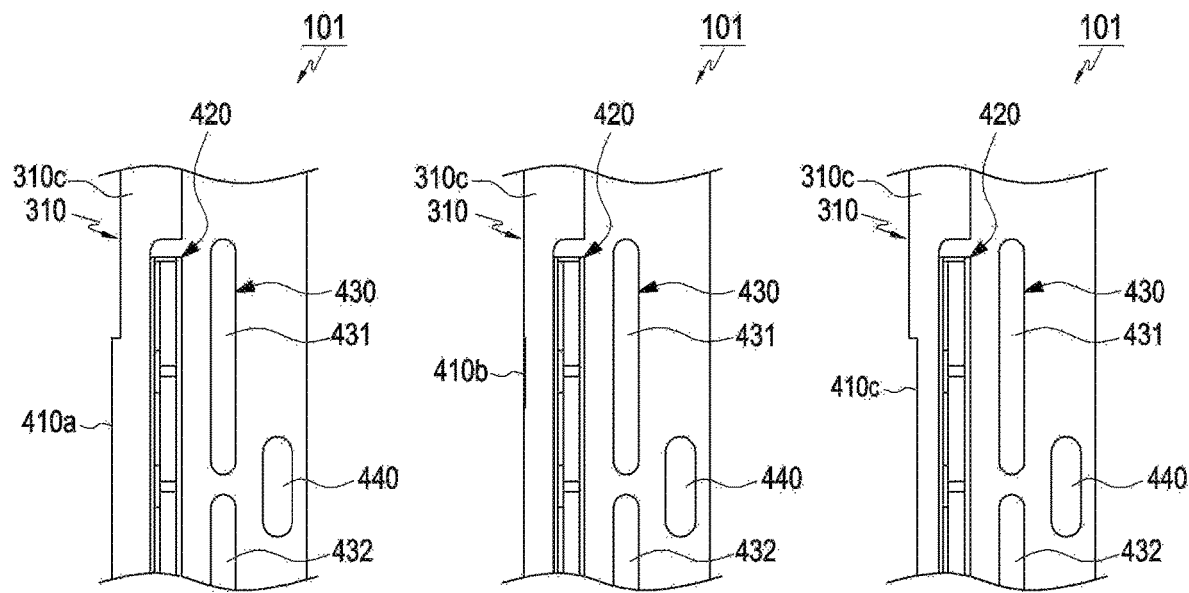
FIG. 16A is a side cross-sectional view illustrating an example input section according to various embodiments.
FIG. 16B is a side cross-sectional view illustrating an example input section according to various embodiments.
FIG. 16C is a side cross-sectional view illustrating an example input section according to various embodiments.

FIG. 16A is a side cross-sectional view illustrating an example input area according to various embodiments, FIG. 16B is a side cross-sectional view illustrating an example input area according to various embodiments, and FIG. 16C is a side cross-sectional view illustrating an example input area according to various embodiments.

Referring to FIGS. 16A, 16B and 16C, the input area 410 may be formed in various shapes on the outer surface of the housing 310. The configuration of the input area 410 shown in FIGS. 16A, 16B and 16C may be entirely or partially the same as the configuration of the input area 410 shown in FIGS. 12, 13, 14, 15A, 15B and 15C.

According to various embodiments, the input area 410 may provide information about the position where the input area 410 is formed to a user, using at least one of visual information and tactual information. According to an embodiment, the input area 410 includes at least one of an embossed key area 410a, an engraved key area 410c, a curved key area (not shown), a glossy key area (not shown), a matte key area (not shown), a light-emitting area (not shown), a printed area (not shown), or a color area (not shown), thereby being able to provide visual information about the position where the input area 410 is formed to a user. According to another embodiment, the input area 410 includes at least one of a sandblasted area (not shown), an embossed key area 410a, an engraved key area 410c, or a vibration area (not shown), thereby being able to provide tactual information about the position where the input area 410 is formed to a user. According to various embodiments, the input area 410 may be disposed on the side 310C of the housing 310. According to an embodiment, the embossed key area 410a protruding outward may be disposed on the side 310C of the housing 310. According to another embodiment, the engraved key area 410c recessed a predetermined depth may be disposed on the side 310C of the housing 310. The engraved key area 410c may be a recessed groove. According to another embodiment, the curved key area (not shown) formed in a curved shape may be disposed on the side 310C of the housing 310. The embossed key area 410a, the engraved key area 410c, and the curved key area (not shown) can provide at least one of visual information and tactual information about the position where the input area 410 is formed to a user.

According to various embodiments, the input area 410 can provide tactual information about the position where the input area 410 is formed, based on the surface roughness. According to an embodiment, the sandblasted key area (not shown) having a rough surface may be disposed on the side 310C of the housing 310. When a finger of a user slides on the surface of the housing 310, the sandblasted key area (not shown) comes in contact with the user's finger, so the degree of recognition of the user for the position of the input area 410 can be improved.

According to various embodiments, a non-patterned key area 410b may be disposed in the entire side 310C of the housing 310 or a portion including the upper end of the side 310C. The non-patterned key area 410b may be set by a user. For example, a portion of the side 310C that a user grips or swipes may be set as the non-patterned key area 410b by the user giving input through a display (e.g., the display 330 shown in FIG. 4) of the electronic device 101. The swiping is defined as an input type that a user can give key input by sliding a finger without taking off the finger.

According to various embodiments, the glossy key area (not shown) or the matte key area (not shown) may be disposed on the side 310C of the housing. The matte key area (not shown) is an input area 410 less glossier than the side 310C of the housing 310, which is not the input area 410, of the input area 410, and the glossy key area (not shown) is defined as an input area 410 glossier than the side 310C of the housing 310, which is not the input area 410, of the input area 410. At least one of the glossy key area (not shown) and the matte key area (not shown) can improve the degree of recognition for the position of the input area 410 of a user due to a visual difference.

According to various embodiments, at least one of the light-emitting area (not shown), the printed area (not shown), or the color area (not shown) may be disposed on the side 310C of the housing. The light-emitting area (not shown), which is an input area 410 receiving light emitted from a light-emitting element (not shown), can provide visual information about the position where the input area 410 is formed to a user. The printed area (not shown) can provide visual information about the position where the input area 410 is formed, based on at least one of a character, a symbol, or a number printed in the input area 410. The color area (not shown), which is an input area 410 having a different color from the housing 310 which is not the color area 410, can provide visual information about the position where the input area 410 is formed to a user.

According to various embodiments, the vibration area (not shown) may be disposed on the side 310C of the housing. A processor (e.g., the processor 120 shown in FIG. 1) may be configured to sense input to the input area 410 from a user through a sensor module (e.g., the sensor module 176 shown in FIG. 1) and generate vibration using a motor (not shown) when a user comes in contact with the vibration area (not shown). The vibration area (not shown) can provide tactual information about the position where the input area 410 is formed to a user.

Figure 17A:
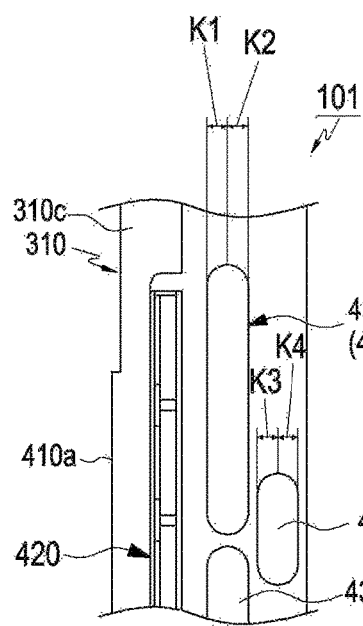
FIG. 17A is an enlarged side view illustrating an example first opening and second opening according to various embodiments.
Figure 17B:
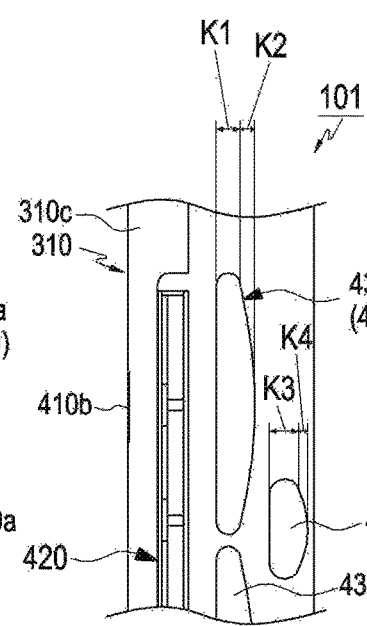
FIG. 17B is an enlarged side view illustrating an example first opening and second opening according to various embodiments.
Figure 17C:
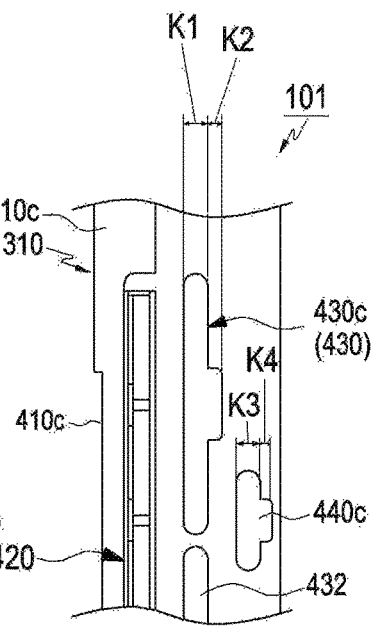
FIG. 17C is an enlarged side view illustrating an example first opening and second opening according to various embodiments.

FIG. 17A is an enlarged side view illustrating an example first opening and second opening according to various embodiments, FIG. 17B is an enlarged side view illustrating an example first opening and second opening according to various embodiments, and FIG. 17C is an enlarged side view illustrating an example first opening and second opening according to various embodiments.

Referring to FIGS. 17A, 17B and 17C, at least one of the first opening 430 or the second opening 440 may be formed in various shapes. The configuration of the first opening 430 and the second opening 440 shown in FIGS. 17A, 17B and 17C may be entirely or partially the same as the first opening 430 and the second opening 440 shown in FIGS. 5, 6, 7, 8 and 9.

According to various embodiments, the first opening 430 may include a first opening area K1 and a second opening area K2 to be deformed step by step by pressure (e.g., the pressure P1 shown in FIGS. 10A and 10B) applied from the outside. The first opening area K1 may be deformed substantially simultaneously with the time point of deformation of the input area 410 by the pressure P1 applied to the input area 410. The second opening area K2 may be deformed when additional pressure is applied to the input area 410 after the first opening area K1 is deformed by the pressure P1 applied to the input area 410.

According to various embodiments, the second opening 440 may include a third opening area K3 and a fourth opening area K4 to be deformed step by step by the pressure P1. According to an embodiment, the third opening area K3 may be deformed substantially simultaneously with the time point of deformation of the first opening area K1 and the fourth opening area K4 may be deformed substantially simultaneously with the time point of deformation of the second opening area K2. According to another embodiment, the third opening area K3 may be deformed substantially simultaneously with the time point of deformation of the second opening area K2 and the fourth opening area K4 may be deformed after the third opening area K3 is deformed. According to another embodiment, the third opening area K3 may be deformed after the second opening area K2 is deformed and the fourth opening area K4 may be deformed after the third opening area K3 is deformed.

According to various embodiments, at least one of the first opening 430 or the second opening 440 may be formed in shapes that can be deformed step by step by pressure P1. According to an embodiment, the first opening 430 is flat on the surface facing an oblong opening 430a and the sensor assembly 420 and the opposite surface thereof may be formed in at least one shape of openings 430c where a protrusion extending from a convex opening 430b or an oblong opening is formed. According to another embodiment, the second opening 440 is flat on the surface facing an oblong opening 440a and the sensor assembly 420 and the opposite surface thereof may be formed in at least one shape of openings 440c where a protrusion extending from a convex opening 440b or an oblong opening is formed.

According to various embodiments, the pressure P1 may be applied to at least one input area 410 disposed on the outer surface O1 of the housing 310. The sensor assembly 420 may be primarily deformed by the pressure P1 applied to the input area 410. The first opening area K1 may be deformed substantially simultaneously with the time point of deformation of the input area 410. The pressure P1 may concentrate on the sensor assembly 420 substantially simultaneously with the time point of deformation of the first opening area K1. For example, a pressure sensor (e.g., the pressure sensor 422 shown in FIG. 6) of the sensor assembly 420 can sense and convert the pressure P1 into a signal and can transmit the signal to a processor (e.g., the processor 120 shown in FIG. 1). The processor 120 can perform a first operation in the input area 410 in the electronic device 101 in response to the signal. The first operation is defined as an operation of the processor 120 based on the signal sensed by the sensor assembly 420 through deformation of the first opening area K1.

According to various embodiments, the second opening area K2 may be deformed when the pressure P1 is further applied to the input area 410 after the first opening area K1 is deformed. The sensor assembly 420 may be secondarily deformed by the pressure (not shown) additionally applied to the input area 410. The pressure P1 applied to the input area 410 may concentrate on the sensor assembly 420 substantially simultaneously with the time point of deformation of the second opening area K2. For example, the pressure sensor 422 can sense and convert the additionally applied pressure (not shown) into a signal and can transmit the signal to a processor (e.g., the processor 120 shown in FIG. 1). The processor 120 can perform a second operation in the input area 410 in the electronic device 101 in response to the signal. The second operation is defined as an operation of the processor 120 based on the signal sensed by the sensor assembly 420 through deformation of the second opening area K2.

According to various embodiments, the processor 120 can separately perform the first operation and the second operation of the electronic device 101, based on the pressure P1 obtained step by step in the input area 410. For example, the at least one input area 410 may be configured to function as a camera shutter key. When a camera module (e.g., the camera module 180 shown in FIG. 1) of the electronic device 101 takes a picture, the input area 410 can obtain the pressure P1. The input area 410 and the sensor assembly 420 may be primarily pressed by the pressure P1 and deformed substantially simultaneously with the time point of the pressing. The first opening area K1 of the first opening 430 may also be deformed substantially simultaneously with the time point of pressing of the input area 410. The sensor assembly 420 can sense and convert the pressure P1 into a signal and transmit the signal to the processor 120. The processor 120 can operate the camera module 180 in a semi-shutter mode (e.g., a function of adjusting the focus of the camera) in response to the signal. Pressure P1 may be additionally applied to the input area 410 configured to perform the function of a camera shutter key. The input area 410 and the sensor assembly 420 may be secondarily pressed by the additionally applied pressure (not shown) and deformed substantially simultaneously with the time point of the pressing. The second opening area K2 of the first opening 430 may also be deformed substantially simultaneously with the time point of pressing of the input area 410. The sensor assembly 420 can sense and convert the additionally applied pressure (not shown) into a signal and transmit the signal to the processor 120. The processor 120 can operate the camera module 180 in a shutter mode (e.g., a function of taking a still image and/or a moving image) in response to the signal.

According to various embodiments, the sensor assembly 420 can sense and convert the pressure P1 into a signal step by step, based on at least one first opening 430 including the first opening area K1 and the second opening area K2, and the second opening 440 including the third opening area K3 and the fourth opening area K4. The processor 120 can perform various operations of the electronic device 101 in response to the signal.

According to various example embodiments, an electronic device (e.g., the electronic device 101 show in FIG. 1) includes: a housing (e.g., the housing 310 shown in FIG. 2); at least one input area (e.g., the input area 410 shown in FIG. 5) disposed on an outer surface (e.g., the outer surface O1 shown in FIG. 7) of the housing facing a first direction (e.g., the first direction (+X direction) shown in FIG. 5); a sensor assembly (e.g., the sensor assembly 420 shown in FIG. 8) including at least one pressure sensor disposed on an inner surface (e.g., the inner surface I1 shown in FIG. 7) of the housing, the inner surface facing a second direction (e.g., the second direction (−X direction) shown in FIG. 5) opposite to the first direction, the sensor assembly configured to sense pressure applied to the input area; at least one first opening (e.g., the first opening 430 shown in FIG. 9) provided at a first portion (e.g., the first portion 404 shown in FIG. 5) of the housing adjacent to the sensor assembly; and a second opening (e.g., the second opening 440 shown in FIG. 9) provided at a second portion (e.g., the second portion 406 shown in FIG. 5) of the housing spaced apart from the first opening in the second direction, wherein the first opening and the second opening may be configured to be deformed based on the pressure applied to the input area.

According to various example embodiments, when the first opening is seen in the first direction, at least a portion of the first opening may overlap the input area.

According to various example embodiments, the first opening may include a fourth opening (e.g., the fourth opening 431 shown in FIG. 9), a fifth opening (e.g., the fifth opening 432 shown in FIG. 9), and a sixth opening (e.g. the sixth opening 433 shown in FIG. 9), and the electronic device may further include a first bridge (e.g., the first bridge 462 shown in FIG. 9) provided between the fourth opening and the fifth opening and a second bridge (e.g., the second bridge 464 shown in FIG. 9) provided between the fifth opening and the sixth opening.

According to various example embodiments, when the input area is seen in the first direction, the input area may include a first input area (e.g., the first input area 412 shown in FIG. 5) at least partially overlapping the fourth opening and the fifth opening and a second input area (e.g., the second input area 414 shown in FIG. 5) at least partially overlapping the sixth opening.

According to various example embodiments, the first bridge may overlap the first input area when the first bridge is seen in the first direction, and the second bridge may overlap a grip area (e.g., the grip area 416 shown in FIG. 5) between the first input area and the second input area when the second bridge is seen in the first direction.

According to various example embodiments, when the second opening is seen in the first direction, the second opening may at least partially overlap the input area and the first bridge.

According to various example embodiments, a first length (e.g., the first length L1 shown in FIG. 9) of the first opening that is a length in a third direction (e.g., the third direction (+Z direction) shown in FIG. 5) substantially perpendicular to the first direction or the second direction may be larger than a first width (e.g., the first width W1 shown in FIG. 9) that is a length in the first direction, and a fourth length (e.g., the fourth length L4 shown in FIG. 9) of the second opening that is a length in the third direction may be larger than a fourth width (e.g., the fourth width W4 shown in FIG. 9) that is the length in the first direction.

According to various example embodiments, the first length may be greater than the fourth length and the first width may be less than the fourth width.

According to various example embodiments, the sensor assembly may include: at least one plate (e.g., the plate 421 shown in FIG. 6) configured to be deformed based on the pressure applied to the input area; at least one pressure sensor (e.g., the pressure sensor 422 shown in FIG. 6) configured to sense deformation of the plate; and a flexible printed circuit board (e.g., the flexible printed circuit board 423 shown in FIG. 6) electrically connected with the pressure sensor.

According to various example embodiments, the flexible printed circuit board may have a first surface (e.g., the first surface 423a shown in FIG. 8) facing the inner surface of the housing; a second surface (e.g., the second surface 423b shown in FIG. 8) facing an opposite direction the first surface; a third surface (e.g., the third surface 423c shown in FIG. 8) facing the second surface; and a fourth surface (e.g., the fourth surface 423d shown in FIG. 8) facing a direction opposite the third surface, wherein the plate may be disposed on the second surface and the pressure sensor may be disposed between the third surface of the flexible printed circuit board and the plate.

According to various example embodiments, the sensor assembly may include an attaching member (e.g., the attachment member 426 shown in FIG. 8) comprising an adhesive material configured to couple the flexible printed circuit board to the inner surface of the housing; and the attachment member may be disposed on the first surface of the flexible printed circuit board.

According to various example embodiments, the electronic device may further include a third opening (e.g., the third opening 450 shown in FIG. 10) spaced apart from the second opening in the second direction and configured to be deformed based on the pressure.

According to various example embodiments, when the third opening is seen in the first direction, at least a portion of the third opening may overlap the second opening.

According to various example embodiments, the housing may include a seating area (e.g., the seating area 401 shown in FIG. 6) configured to accommodate the sensor assembly.

According to various example embodiments, the input area may include at least one of an engraved key area (e.g., the engraved key area 410c shown in FIGS. 15A, 15B and 15C), an embossed key area (e.g., the embossed key area 410a shown in FIGS. 15A, 15B and 15C), a curved key area, a matte key area, a glossy key area, a sandblasted area, or a non-patterned key area (e.g., the engraved key area 410b shown in FIGS. 15A, 15B and 15C).

According to various example embodiments, an electronic device includes: a housing including at least one input area disposed on an outer surface of the housing; a sensor assembly disposed on an inner surface facing a second direction opposite the outer surface of the housing and configured to sense pressure applied to the input area; a plurality of first openings of the housing disposed adjacent to the sensor assembly; at least one bridge disposed between the plurality of first openings; and a second opening spaced apart from the bridge in the second direction, wherein the first opening and the second opening may be configured to concentrate pressure applied on the sensor assembly.

According to various example embodiments, when the first opening is seen in the second direction, the input area may overlap at least a portion of the first opening.

According to various example embodiments, the input area may include a first input area configured to perform at least two or more functions, and when the first input area is seen in the second direction, at least a portion of the first input area may overlap the first opening, the second opening, and the bridge.

According to various example embodiments, a bracket (e.g., the first supporting member 332 shown in FIG. 4 (e.g., the bracket)) of an electronic device includes: at least one input area disposed on a side of a support facing a first direction; a seating area configured to accommodate a sensor assembly configured to sense pressure applied to the input area; a first opening spaced apart from the seating area in a second direction opposite the first direction; and a second opening spaced apart from the first opening in the second direction, wherein the first opening and the second opening may be configured to be deformed based on pressure applied to the input area.

According to various example embodiments, the seating area may be disposed between the input area and the first opening.

Electronic devices including openings according to various example embodiments described above are not limited to the embodiments and drawings described above and it would be apparent to those skilled in the art that the electronic devices may be replaced, changed, and modified in various ways within the scope of the disclosure.

While the disclosure has been illustrated and described with reference to various example embodiments thereof, it will be understood that the various example embodiments are intended to be illustrative, not limiting. It will be further understood by one of ordinary skill in the art that various changes in form and detail may be made without departing from the true spirit and full scope of the disclosure, including the appended claims and equivalents thereof.

What is claimed is:

1. An electronic device comprising:
a housing;
at least one input area disposed on an outer surface of the housing and facing a first direction;
a sensor assembly including at least one pressure sensor disposed on an inner surface of the housing facing a second direction opposite the first direction, and configured to sense pressure applied to the input area;
at least one first opening provided at a first portion of the housing adjacent to the sensor assembly; and
a second opening provided at a second portion of the housing spaced apart from the first opening in the second direction,
wherein the at least one first opening and the second opening are configured to be deformed based on the pressure applied to the input area and the sensor assembly is provided outside of the at least one first opening and between the at least one input area and the at least one first opening.

2. The electronic device of claim 1, wherein when the first opening is viewed in the first direction, the input area overlaps at least a portion of the first opening.

3. The electronic device of claim 2, wherein the first opening includes a fourth opening, a fifth opening, and a sixth opening, and
the electronic device further comprises:
a first bridge provided between the fourth opening and the fifth opening; and
a second bridge provided between the fifth opening and the sixth opening.

4. The electronic device of claim 3, wherein when the input area is viewed in the first direction, the input area includes a first input area at least partially overlapping the fourth opening and the fifth opening and a second input area at least partially overlapping the sixth opening.

5. The electronic device of claim 4, wherein the first bridge overlaps the first input area when the first bridge is viewed in the first direction, and the second bridge overlaps a grip area between the first input area and the second input area when the second bridge is viewed in the first direction.

6. The electronic device of claim 3, wherein when the second opening is viewed in the first direction, the second opening at least partially overlaps the input area and the first bridge.

7. The electronic device of claim 1, wherein a first length of the first opening in a third direction substantially perpendicular to the first direction or the second direction is longer than a first width in the first direction, and
a fourth length of the second opening in the third direction is longer than a fourth width in the first direction.

8. The electronic device of claim 7, wherein the first length is longer than the fourth length and the first width is less than the fourth width.

9. The electronic device of claim 1, wherein the sensor assembly includes at least one plate configured to be deformed based on the pressure applied to the input area, at least one pressure sensor configured to sense deformation of the plate, and a flexible printed circuit board electrically connected to the pressure sensor.

10. The electronic device of claim 9, wherein the flexible printed circuit board includes a first surface facing the inner surface of the housing, a second surface facing a direction opposite the first surface, a third surface facing the second surface, and a fourth surface facing a direction opposite the third surface, wherein the plate is disposed on the second surface and the pressure sensor is disposed between the third surface of the flexible printed circuit board and the plate.

11. The electronic device of claim 10, wherein the sensor assembly includes an attaching member comprising an adhesive material configured to couple the flexible printed circuit board to the inner surface of the housing, and the attachment member is disposed on the first surface of the flexible printed circuit board.

12. The electronic device of claim 1, further comprising a third opening spaced apart from the second opening in the second direction and configured to be deformed based on the pressure.

13. The electronic device of claim 12, wherein when the third opening is viewed in the first direction, at least a portion of the third opening overlaps the second opening.

14. The electronic device of claim 1, wherein the housing includes a seating area configured to accommodate the sensor assembly.

15. The electronic device of claim 1, wherein the input area includes at least one of an engraved key area, an embossed key area, a curved key area, a matte key area, a glossy key area, a sandblasted key area, or a non-patterned key area.

16. An electronic device comprising:
a housing including at least one input area disposed on an outer surface of the housing;
a sensor assembly disposed on an inner surface of the housing facing a second direction opposite the outer surface and configured to sense pressure applied to the input area;
a plurality of first openings of the housing adjacent to the sensor assembly;
at least one bridge disposed between the plurality of first openings; and
a second opening spaced apart from the bridge in the second direction,
wherein the plurality of first openings and the second opening are configured to concentrate the pressure on the sensor assembly and the sensor assembly is provided outside of the plurality of first openings and between the at least one input area and the plurality of first openings.

17. The electronic device of claim 16, wherein when the first opening is viewed in the second direction, the input area overlaps at least a portion of the first opening.

18. The electronic device of claim 16, wherein the input area includes a first input area configured to perform at least two or more functions, and when the first input area is viewed in the second direction, at least a portion of the first input area overlaps the first opening, the second opening, and the bridge.

19. A bracket of an electronic device, comprising:
at least one input area disposed on a side of the bracket facing a first direction;
a seating area configured to accommodate a sensor assembly including at least one pressure sensor configured to sense pressure applied to the input area;
a first opening spaced apart from the seating area in a second direction opposite the first direction; and
a second opening spaced apart from the first opening in the second direction,
wherein the first opening and the second opening are configured to be deformed based on the pressure applied to the input area and the seating area is provided outside of the first opening.

20. The bracket of claim 19, wherein the seating area is disposed between the input area and the first opening.

* * * * *